(12) United States Patent
Yamanaka

(10) Patent No.: US 8,305,162 B2
(45) Date of Patent: *Nov. 6, 2012

(54) SURFACE ACOUSTIC WAVE RESONATOR AND SURFACE ACOUSTIC WAVE OSCILLATOR

(75) Inventor: Kunihito Yamanaka, Kamiina (JP)

(73) Assignee: Seiko Epson Corporation (JP)

( * ) Notice: Subject to any disclaimer, the term of this patent is extended or adjusted under 35 U.S.C. 154(b) by 304 days.

This patent is subject to a terminal disclaimer.

(21) Appl. No.: 12/712,275

(22) Filed: Feb. 25, 2010

(65) Prior Publication Data

US 2010/0219913 A1    Sep. 2, 2010

(30) Foreign Application Priority Data

Feb. 27, 2009 (JP) ................................. 2009-045359
Mar. 4, 2009 (JP) ................................. 2009-050112
Dec. 16, 2009 (JP) ................................. 2009-285224

(51) Int. Cl.
*H03H 9/00* (2006.01)
*H01L 41/047* (2006.01)

(52) U.S. Cl. ...................... 333/193; 333/195; 310/313 B

(58) Field of Classification Search ................. 333/133, 333/193, 194, 195, 196; 310/313 A, 313 B
See application file for complete search history.

(56) References Cited

U.S. PATENT DOCUMENTS

| | | | |
|---|---|---|---|
| 4,387,355 A | 6/1983 | Uno et al. | |
| 5,179,310 A | 1/1993 | Satoh et al. | |
| 6,154,105 A | 11/2000 | Fujimoto et al. | |
| 6,329,888 B1 | 12/2001 | Hirota | |
| 6,414,414 B1 | 7/2002 | Wright | |
| 6,774,747 B2 | 8/2004 | Yamazaki et al. | |
| 6,784,595 B2 | 8/2004 | Iizawa et al. | |
| 6,856,218 B2 * | 2/2005 | Yamazaki et al. | 333/193 |
| 6,946,930 B2 | 9/2005 | Kadota et al. | |
| 7,135,805 B2 | 11/2006 | Yamanouchi | |
| 7,352,104 B2 | 4/2008 | Yamazaki et al. | |
| 7,382,217 B2 * | 6/2008 | Morita et al. | 333/195 |

(Continued)

FOREIGN PATENT DOCUMENTS

JP    54-156455    12/1979

(Continued)

OTHER PUBLICATIONS

Shimizu, Yasutaka et al., "A New Cut of Quartz for SAW With More Stable Temperature Characteristics", Tokyo Institute of Technology, Nippon Electric Co., Ltd., Mar. 26, 1982, pp. 558-564.

(Continued)

*Primary Examiner* — Dean O Takaoka
(74) *Attorney, Agent, or Firm* — Harness, Dickey & Pierce, P.L.C.

(57) ABSTRACT

A surface acoustic wave resonator includes: an IDT which is disposed on a quartz crystal substrate with an Euler angle of $(-1.5° \leq \phi \leq 1.5°, 117° \leq \theta \leq 142°, 41.9° \leq |\psi| \leq 49.57°)$ and which excites a surface acoustic wave in an upper mode of a stop band; and an inter-electrode-finger groove formed by recessing the quartz crystal substrate between electrode fingers of the IDT, wherein the following expression:

$$0.01\lambda \leq G$$

where $\lambda$ represents a wavelength of the surface acoustic wave and G represents a depth of the inter-electrode-finger groove, is satisfied and when a line occupancy of the IDT is $\eta$, the depth of the inter-electrode-finger groove G and the line occupancy $\eta$ are set to satisfy the following expression:

$$-2.5 \times G/\lambda + 0.675 \leq \eta \leq -2.5 \times G/\lambda + 0.775.$$

9 Claims, 31 Drawing Sheets

U.S. PATENT DOCUMENTS

| | | | |
|---|---|---|---|
| 7,589,451 B2 | 9/2009 | Morita et al. | |
| 7,696,675 B2 * | 4/2010 | Kanna | 310/361 |
| 8,063,534 B2 * | 11/2011 | Iizawa | 310/313 B |
| 8,084,918 B2 * | 12/2011 | Iizawa | 310/313 B |
| 2002/0171512 A1 | 11/2002 | Kadota et al. | |
| 2003/0030513 A1 * | 2/2003 | Yamazaki et al. | 333/195 |
| 2003/0052572 A1 | 3/2003 | Iizawa et al. | |
| 2003/0146810 A1 | 8/2003 | Yamazaki et al. | |
| 2004/0135469 A1 | 7/2004 | Kanna | |
| 2004/0201306 A1 | 10/2004 | Yamanouchi | |
| 2005/0127781 A1 | 6/2005 | Yamazaki et al. | |
| 2006/0108894 A1 | 5/2006 | Kanna | |
| 2006/0145568 A1 | 7/2006 | Morita et al. | |
| 2007/0182278 A1 | 8/2007 | Kanna | |
| 2008/0084134 A1 | 4/2008 | Morita et al. | |
| 2009/0206955 A1 | 8/2009 | Iizawa | |
| 2010/0001617 A9 | 1/2010 | Kanna | |
| 2010/0219913 A1 | 9/2010 | Yamanaka | |
| 2010/0244626 A1 * | 9/2010 | Yamanaka | 310/313 B |
| 2011/0309897 A1 * | 12/2011 | Yamanaka | 333/195 |
| 2012/0049969 A1 * | 3/2012 | Owaki et al. | 331/158 |
| 2012/0049979 A1 * | 3/2012 | Owaki et al. | 333/195 |
| 2012/0062069 A1 * | 3/2012 | Yamanaka | 310/313 A |
| 2012/0062329 A1 * | 3/2012 | Yamanaka | 331/158 |
| 2012/0086308 A1 * | 4/2012 | Obata et al. | 310/313 A |

FOREIGN PATENT DOCUMENTS

| | | |
|---|---|---|
| JP | 57-5418 | 1/1982 |
| JP | 57-099813 | 6/1982 |
| JP | 58-033309 | 2/1983 |
| JP | 61-092011 | 5/1986 |
| JP | 1-34411 | 7/1989 |
| JP | 01-231412 | 9/1989 |
| JP | 2-189011 | 7/1990 |
| JP | 03-284009 | 12/1991 |
| JP | 5-90865 | 4/1993 |
| JP | 05-090865 | 4/1993 |
| JP | 10-270974 | 10/1998 |
| JP | 11-214958 | 8/1999 |
| JP | 11-298290 | 10/1999 |
| JP | 2000-188521 | 7/2000 |
| JP | 2002-100959 | 4/2002 |
| JP | 2002-517933 | 6/2002 |
| JP | 2002-330051 | 11/2002 |
| JP | 2003-124780 | 4/2003 |
| JP | 2003-152487 | 5/2003 |
| JP | 2003-258601 | 9/2003 |
| JP | 2005-012736 | 1/2005 |
| JP | 2005-204275 | 7/2005 |
| JP | 2006-074136 | 3/2006 |
| JP | 2006-148622 | 6/2006 |
| JP | 2006-186623 | 7/2006 |
| JP | 2006-203408 | 8/2006 |
| JP | 3851336 | 9/2006 |
| JP | 2006-295311 | 10/2006 |
| JP | 2006-339742 | 12/2006 |
| JP | 2007-028664 | 2/2007 |
| JP | 2007-093213 | 4/2007 |
| JP | 2007-142794 | 6/2007 |
| JP | 2007-208871 | 8/2007 |
| JP | 2007-259414 | 10/2007 |
| JP | 2007-267033 | 10/2007 |
| JP | 2007-281701 | 10/2007 |
| JP | 2007-300174 | 11/2007 |
| JP | 2007-300287 | 11/2007 |
| JP | 2007-333500 | 12/2007 |
| JP | 2008-078984 | 4/2008 |
| JP | 2008-236295 | 10/2008 |
| JP | 2008-286520 | 11/2008 |
| JP | 2008-286521 | 11/2008 |
| JP | 2009-225420 | 10/2009 |
| JP | 2010-233203 | 10/2010 |
| WO | 2005-099089 | 10/2005 |
| WO | 2010-098139 | 9/2010 |

OTHER PUBLICATIONS

Uno, et al. "Fabrication of SAW Resonators with Groove Gratings and their Characteristics", Technological Research Report of the Institute of Electronics and Communication Engineers of Japan MW82-59 (1982).

* cited by examiner

| | F | Q | γ | CI | M |
|---|---|---|---|---|---|
| | MHz | | | Ω | |
| AVG | 318.25 | 13285 | 2476 | 21.8 | 5.4 |

SURFACE ACOUSTIC WAVE RESONATOR AND SURFACE ACOUSTIC WAVE OSCILLATOR

BACKGROUND

1. Technical Field

The present invention relates to a surface acoustic wave resonator and a surface acoustic wave oscillator having the surface acoustic wave resonator, and more particularly, to a surface acoustic wave resonator in which grooves are formed in a substrate surface and a surface acoustic wave oscillator having the surface acoustic wave resonator.

2. Related Art

In a surface acoustic wave (SAW) device (such as a SAW resonator), a variation in frequency-temperature characteristic is greatly affected by a stop band of the SAW or a cut angle of a quartz crystal substrate, and a shape of an IDT (Interdigital Transducer).

For example, JP-A-11-214958 discloses a configuration for exciting an upper mode and a lower mode of a stop band of a SAW and a standing wave distribution in the upper mode and the lower mode of the stop band.

JP-A-2006-148622, JP-A-2007-208871, JP-A-2007-267033, and JP-A-2002-100959 disclose that the upper mode of the stop band has a frequency-temperature characteristic more excellent than that in the lower mode of the stop band of the SAW. JP-A-2006-148622 and JP-A-2007-208871 disclose that the cut angle of the quartz crystal substrate is adjusted and a normalized thickness (H/λ) of an electrode is increased to about 0.1 so as to obtain an excellent frequency-temperature characteristic in a SAW device using Rayleigh waves.

JP-A-2007-267033 discloses that the cut angle of the quartz crystal substrate is adjusted and a normalized thickness (H/λ) of an electrode is increased to about 0.045 or greater in a SAW device using Rayleigh waves.

JP-A-2002-100959 discloses that a rotational Y-cut X-propagation quartz crystal substrate is employed and that the frequency-temperature characteristic is more improved than that in the case where the resonance in the lower mode of the stop band is used, by using the resonance in the upper end of the stop band.

In a SAW device employing an ST-cut quartz crystal substrate, grooves are disposed between electrode fingers of an IDT or between conductor strips of a reflector, which is described in JP-A-57-5418 and "Manufacturing Conditions and Characteristics of Groove-type SAW. Resonator", Technological Research Report of the Institute of Electronics and Communication Engineers of Japan MW82-59 (1982). The "Manufacturing Conditions and Characteristics of Groove-type SAW Resonator" also discloses that the frequency-temperature characteristic varies depending on the depth of the grooves.

Japanese Patent No. 3851336 discloses that a configuration for setting a curve representing the frequency-temperature characteristic to a three-dimensional curve is used in the SAW device employing an LST-cut quartz crystal substrate and that any substrate with a cut angle having a temperature characteristic represented by a three-dimensional curve could not be discovered in a SAW device employing Rayleigh waves.

As described above, there exist various factors for improving the frequency-temperature characteristic. Particularly, in the SAW. device employing the Rayleigh waves, the increase in thickness of an electrode of an IDT is considered as a factor contributing to the frequency-temperature characteristic.

However, the applicant of the invention experimentally discovered that the environment resistance characteristic such as a temporal variation characteristic or a temperature impact resistance characteristic is deteriorated by increasing the thickness of the electrode. For the main purpose of improvement in the frequency-temperature characteristic, the thickness of the electrode should be increased as described above, and it is thus difficult to avoid the deterioration in the temporal variation characteristic or the temperature impact resistance characteristic. This is true of a Q value and it is difficult to increase the Q value without increasing the thickness of the electrode.

SUMMARY

An advantage of some aspects of the invention is that it provides a surface acoustic wave resonator and a surface acoustic wave oscillator which can realize an excellent frequency-temperature characteristic, with improved environment resistance, and with a high Q value.

Some aspects of the invention can solve at least a part of the problems mentioned above and can be embodied as the following forms or application examples.

APPLICATION EXAMPLE 1

Application Example 1 of the invention is directed to a surface acoustic wave resonator including an IDT which is disposed on a quartz crystal substrate with an Euler angle of $(-1.5°{\leq}\phi{\leq}1.5°, 117°{\leq}\theta{\leq}142°, 41.9°{\leq}|\psi|{\leq}49.5749°)$ and which excites a surface acoustic wave in an upper mode of a stop band, and an inter-electrode-finger groove formed by recessing the quartz crystal substrate between electrode fingers of the IDT, wherein the following expression (1):

$$0.01\lambda {\leq} G \quad (1)$$

where λ represents a wavelength of the surface acoustic wave and G represents a depth of the inter-electrode-finger groove, is satisfied, and when a line occupancy of the IDT is η, the depth of the inter-electrode-finger groove G and the line occupancy η satisfy the following expression (2):

$$-2.5{\times}G/\lambda+0.675{\leq}\eta{\leq}-2.5{\times}G/\lambda+0.775 \quad (2).$$

According to this configuration, it is possible to improve the frequency-temperature characteristic.

APPLICATION EXAMPLE 2

Application Example 2 of the invention is directed to the surface acoustic wave resonator according to Application 1, wherein the depth of the inter-electrode-finger groove G satisfies the following expression (3):

$$0.01{\times}G{\leq}0.0695\lambda \quad (3).$$

According to this configuration, it is possible to suppress the shift in resonance frequency among individuals to a correction range even when the depth of the inter-electrode-finger groove G is deviated due to manufacturing errors.

APPLICATION EXAMPLE 3

Application Example 3 of the invention is directed to the surface acoustic wave resonator according to Application 1 or 2, wherein the following expression (4):

$$0<H{\leq}0.035\lambda \quad (4)$$

where H represents an electrode thickness of the IDT, is satisfied.

According to this configuration, it is possible to realize the excellent frequency-temperature characteristic in an operating temperature range. According to this configuration, it is possible to suppress the deterioration in environment resistance with an increase in electrode thickness.

APPLICATION EXAMPLE 4

Application Example 4 of the invention is directed to the surface acoustic wave resonator according to Application 3, wherein the line occupancy η satisfies the following expression (5):

$$\eta = -2.533 \times G/\lambda - 2.269 \times H/\lambda + 0.785 \quad (5).$$

By setting the η so as to satisfy the above-mentioned expression 5 in the electrode thickness range described in Application 3, it is possible to set a secondary temperature coefficient within ±0.01 ppm/°C.$^2$.

APPLICATION EXAMPLE 5

Application Example 5 of the invention is directed to the surface acoustic wave resonator according to Application or 4, wherein the sum of the depth of the inter-electrode-finger groove G and the electrode thickness H satisfies the following expression (6):

$$0.0407\lambda \leq G + H \quad (6).$$

By setting the sum of the depth of the inter-electrode-finger groove G and the electrode thickness H as expressed by the above-mentioned expression 6, it is possible to obtain a Q value higher than that of the existing surface acoustic wave resonator.

APPLICATION EXAMPLE 6

Application Example 6 of the invention is directed to the surface acoustic wave resonator according to any one of Applications 1 to 5, wherein the ψ and θ satisfy the following expression (7):

$$\psi = 1.191 \times 10^{-3} \times \theta^3 - 4.490 \times 10^{-1} \times \theta^2 + 5.646 \times 10^1 \times \theta - 2.324 \times 10^3 \pm 1.0 \quad (7).$$

By manufacturing a surface acoustic wave resonator using a quartz crystal substrate cut out at the cut angle having the above-mentioned feature, it is possible to provide a surface acoustic wave resonator having an excellent frequency-temperature characteristic in a wide range.

APPLICATION EXAMPLE 7

Application Example 7 of the invention is directed to the surface acoustic wave resonator according to any one of Applications 1 to 6, wherein the following expression (8):

$$fr1 < ft2 < fr2 \quad (8)$$

wherein ft2 represents a frequency of the upper mode of the stop band in the IDT, fr1 represents a frequency of the lower mode of the stop band in reflectors disposed to interpose the IDT therebetween in a propagation direction of the surface acoustic wave, and fr2 represents a frequency of the upper mode of the stop band in the reflectors, is satisfied.

According to this configuration, at the frequency ft2 in the upper mode of the stop band of the IDT, the reflection coefficient |Γ| of the reflector is increased and the surface acoustic wave in the upper mode of the stop band excited from the IDT is reflected to the IDT from the reflector with a high reflection coefficient. The energy trapping of the surface acoustic wave in the upper mode of the stop band is strengthened, thereby implementing a surface acoustic wave resonator with a low loss.

APPLICATION EXAMPLE 8

Application Example 8 of the invention is directed to the surface acoustic wave resonator according to any one of Applications 1 to 7, wherein an inter-conductor-strip groove is disposed between conductor strips of the reflectors, and the depth of the inter-conductor-strip groove is smaller than the depth of the inter-electrode-finger groove.

According to this configuration, it is possible to frequency-shift the stop band of the reflector to a higher band than the stop band of the IDT. Accordingly, the relation of the above-mentioned expression 8 can be realized.

APPLICATION EXAMPLE 9

Application Example 9 of the invention is directed to a surface acoustic wave oscillator including the surface acoustic wave resonator according to any one of Applications 1 to 8 and an IC driving the IDT.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, a surface acoustic wave resonator and a surface acoustic wave oscillator according to embodiments of the invention will be described in detail with reference to the accompanying drawings.

Figure 1A:
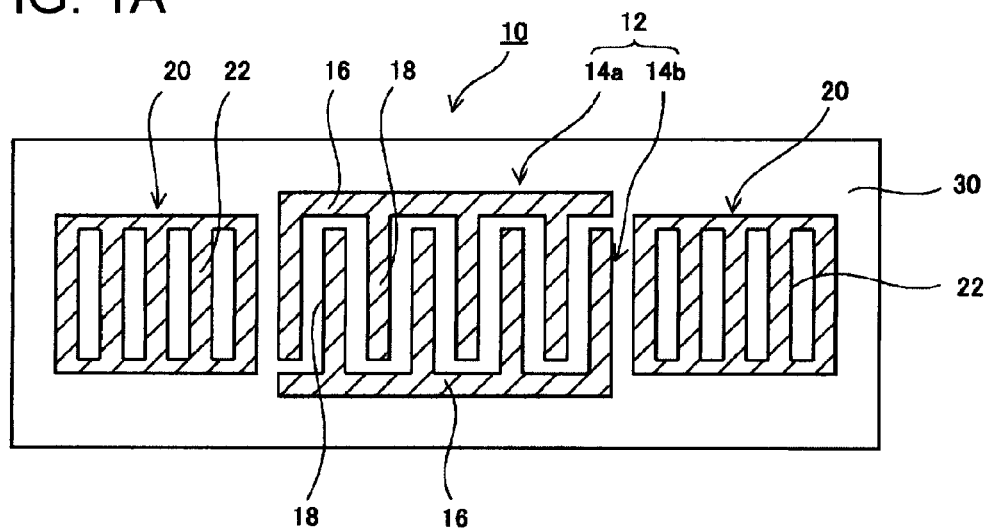
FIGS. 1A, 1B, and 1C are diagrams illustrating a configuration of a SAW device according to an embodiment of the invention.
Figure 1B:
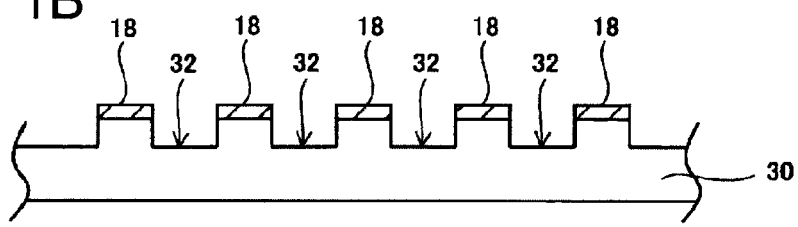
Figure 1C:
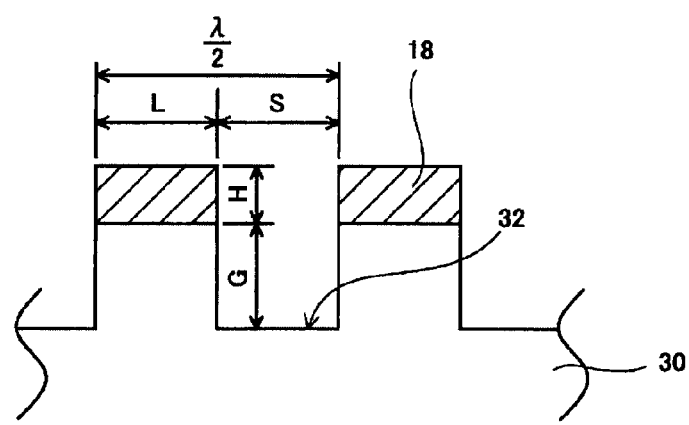

First, a surface acoustic wave (SAW) resonator according to a first embodiment of the invention will be described with reference to FIGS. 1A, 1B, and 1C. FIG. 1A is a plan view of the SAW resonator, FIG. 1B is a partially enlarged sectional view, and FIG. 1C is an enlarged view illustrating the details of FIG. 1B.

The SAW resonator 10 according to this embodiment basically includes a quartz crystal substrate 30, an IDT 12, and a reflector 20. The quartz crystal substrate 30 has crystal axes which are expressed by an X axis (electrical axis), a Y axis (mechanical axis), and a Z axis (optical axis).

In this embodiment, an in-plane rotational ST-cut quartz crystal substrate with Euler angles of (−1°≦φ≦1°, 117°≦θ≦142°, 41.9°≦|ψ|≦49.57°) is employed as the quartz crystal substrate 30. The Euler angle will be described now. A substrate with the Euler angles of (0°, 0°, 0°) is a Z-cut substrate having a main plane perpendicular to the Z axis. Here, φ of the Euler angles (φ, θ, ψ) is associated with a first rotation of the Z-cut substrate, and is a first rotation angle in which a rotating direction about the Z axis from the +X axis to the +Y axis is a positive rotating angle. The Euler angle θ is associated with a second rotation which is carried out after the first rotation of the Z-cut substrate, and is a second rotation angle in which a rotating direction about the X axis after the first rotation from the +Y axis after the first rotation to the +Z axis is a positive rotating angle. The cut plane of a piezoelectric substrate is determined by the first rotation angle φ and the second rotation angle θ. The Euler angle ψ is associated with a third rotation which is carried out after the second rotation of the Z-cut substrate, and is a third rotation angle in which a rotating direction about the Z axis after the second rotation from the +X axis after the second rotation to the +Y axis after the second rotation is a positive rotating angle. The propagation direction of the SAW is expressed by the third rotation angle ψ about the X axis after the second rotation.

The IDT 12 includes a pair of pectinate electrodes 14a and 14b in which the base end portions of plural electrode fingers 18 are connected to each other by a bus bar 16. The electrode fingers 18 of one pectinate electrode 14a (or 14b) and the electrode fingers 18 of the other pectinate electrode 14b (or 14a) are alternately arranged with a predetermined gap therebetween. Here, the electrode fingers 18 are arranged in a direction perpendicular to the X' axis in which the surface acoustic wave is propagated. The SAW excited by the SAW resonator 10 having the above-mentioned configuration is a Rayleigh type SAW and has a vibration displacement component in both the Z axis after the third rotation and the X axis after the third rotation. In this way, by deviating the propagation direction of the SAW from the X axis which is the crystal axis of quartz crystal, it is possible to excite the SAW in the upper mode of the stop band.

Figure 2:
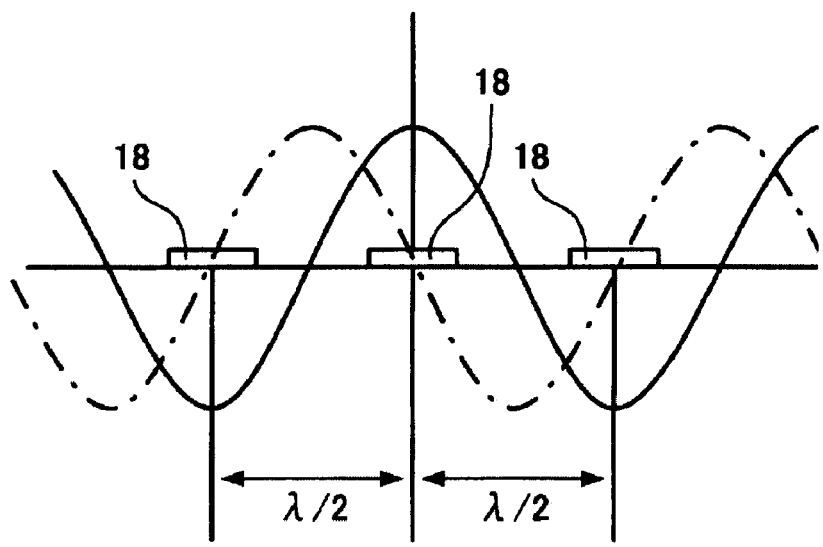
FIG. 2 is a diagram illustrating the relation between an upper mode and a lower mode of a stop band.

The SAW in the upper mode of the stop band and the SAW in the lower mode of the stop band will be described now. In the SAWs in the upper mode and the lower mode of the stop band formed by the regular IDT 12 shown in FIG. 2 (where the electrode fingers 18 of the IDT 12 are shown in FIG. 2), the standing waves are deviated in node and antinode positions by π/2 from each other. FIG. 2 is a diagram illustrating a standing wave distribution in the upper mode and the lower mode of the stop band in the regular IDT 12.

In FIG. 2, as described above, the standing wave in the lower mode of the stop band indicated by a solid line has a node at the center position of each electrode finger 18, that is, at the reflection center position, and the standing wave in the upper mode of the stop band indicated by a one-dot chained line has an antinode at the reflection center position.

A pair of reflectors 20 are disposed so as to interpose the IDT 12 in the propagation direction of the SAW. Specifically, both ends of plural conductor strips 22 disposed parallel to the electrode fingers 18 of the IDT 12 are connected to each other.

An end-reflecting SAW resonator actively using a reflected wave from an end surface in the SAW propagation direction of the quartz crystal substrate or a multipair IDT-type SAW resonator exciting a standing wave of a SAW using only the IDT by increasing the number of electrode finger pairs of the IDT does not necessarily require the reflector.

The electrode films of the IDT 12 or the reflectors 20 having the above-mentioned configuration can be formed of aluminum (Al) or alloy containing Al as a main component. When the alloy is used as the material of the electrode films, metal other than Al as a main component can be contained by 10% or less in terms of the weight.

In the quartz crystal substrate 30 of the SAW resonator 10 having the above-mentioned basic configuration, grooves (inter-electrode-finger grooves) 32 are formed between the electrode fingers of the IDT 12 or the conductor strips of the reflectors 20.

In the grooves 32 formed in the quartz crystal substrate 30, it is preferred that the following expression (9):

$$0.01\lambda \leq G \tag{9}$$

where the wavelength of the SAW in the upper mode of the stop band is λ and the groove depth is G, is satisfied. When the upper limit of the groove depth G is set, as can be seen from FIG. 3., it is preferred that the groove depth is set in the range as expressed by the following expression (10).

$$0.01\lambda \leq G \leq 0.094\lambda \tag{10}$$

By setting the groove depth G to this range, the frequency variation in the operating temperature range (−40° C. to +85° C.) can be suppressed to 25 ppm or less as a target value the details of which will be described later. The groove depth G can be preferably set to satisfy the following expression (11).

$$0.01\lambda \leq G \leq 0.0695\lambda \tag{11}$$

By setting the groove depth G to this range, the shift quantity of the resonance frequency between the individual SAW resonators 10 can be suppressed to a correction range even when a production tolerance occurs in the groove depth G.

The line occupancy η is a value obtained by dividing a line width L of each electrode finger 18 (the width of a convex portion when a quartz crystal convex portion is formed) by a pitch λ/2 (=L+S) between the electrode fingers 18, as shown in FIG. 1C. Therefore, the line occupancy η can be expressed by the following expression (12).

$$\eta = L/(L+S) \tag{12}$$

In the SAW resonator 10 according to this embodiment, the line occupancy η can be determined in the range expressed by the following expression (13). As can be seen from the following expression (13), η can be derived by determining the depth G of the grooves 32.

$$-2.5 \times G/\lambda + 0.675 \leq \eta \leq -2.5 \times G/\lambda + 0.775 \tag{13}$$

The thickness of the electrode film material (of the IDT 12 or the reflectors 20) in the SAW resonator 10 according to this embodiment can be preferably in the range expressed by the following expression (14).

$$0 < H \leq 0.035\lambda \tag{14}$$

In consideration of the electrode thickness expressed by Expression (14), the line occupancy η can be calculated by the following expression (15).

$$\eta = -2.533 \times G/\lambda - 2.269 \times H/\lambda + 0.785 \tag{15}$$

As for the line occupancy η, the production tolerance of the electrical characteristic (particularly, the resonance frequency) increases as the electrode thickness increases. Accordingly, a production tolerance of ±0.04 or less can occur when the electrode thickness H is in the range expressed by the expression (14), and a production tolerance greater than ±0.04 can occur when the electrode thickness is in the range of H>0.035λ. However, When the electrode thickness H is in the range expressed by the expression (14) and the tolerance of the line occupancy η is ±0.04 or less, it is possible to embody a SAW device with a small secondary temperature coefficient β. That is, the line occupancy η can be extended to the range expressed by the following expression (16) which is obtained by adding the tolerance of ±0.04 to the expression (15).

$$\eta = -2.533 \times G/\lambda - 2.269 \times H/\lambda + 0.785 + \pm 0.04 \tag{16}$$

In the SAW resonator 10 according to this embodiment having the above-mentioned configuration, when the secondary temperature coefficient β is within the range of ±0.01 ppm/° C.$^2$ and the operating temperature range is preferably set to −40° C. to +85° C., it is a goal to improve the frequency-temperature characteristic until the frequency variation ΔF in the operating temperature range is 25 ppm or less. Since the secondary temperature coefficient β is a secondary coefficient in an approximate polynomial of a curve representing the frequency-temperature characteristic of the SAW, the small absolute value of the secondary temperature coefficient means a small frequency variation, which means that the frequency-temperature characteristic is excellent. Hereinafter, it is proved by simulation that the SAW device having the above-mentioned configuration has factors for accomplishing the subject of the invention.

In the SAW resonator whose propagation direction is the direction of the crystal X axis using a quartz crystal substrate called an ST cut, when the operating temperature range is constant, the frequency variation ΔF in the operating temperature range is about 117 ppm and the secondary temperature coefficient β is about −0.030 ppm/° C.$^2$. In the SAW resonator which is formed using an in-plane rotation ST-cut quartz crystal substrate in which the cut angle of the quartz crystal substrate and the SAW propagation direction are expressed by Euler angles (0°, 123°, 45°) and the operating temperature range is constant, the frequency variation ΔF is about 63 ppm and the secondary temperature coefficient β is about −0.016 ppm/° C.$^2$.

As described above, the variation in frequency-temperature characteristic of the SAW resonator 10 is affected by the line occupancy η of the electrode fingers 18 or the electrode thickness H of the IDT 12 and the groove depth G. The SAW resonator 10 according to this embodiment employs the excitation in the upper mode of the stop band.

Figure 4A:
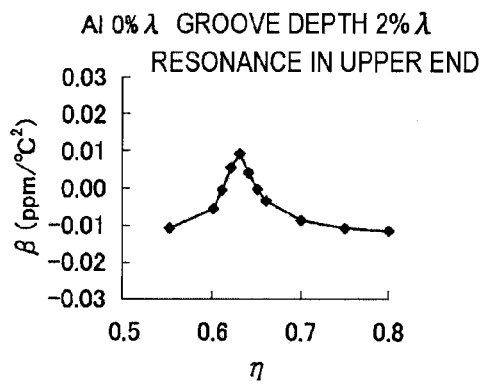
FIGS. 4A to 4D are graphs illustrating a difference in secondary temperature coefficient due to a variation in line occupancy η between a resonance point in the upper mode of the stop band and a resonance point in the lower mode of the stop band.
Figure 4C:
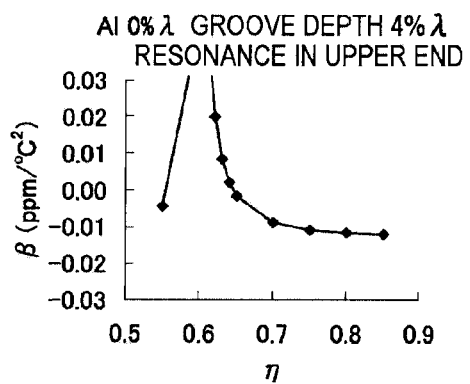
Figure 4B:
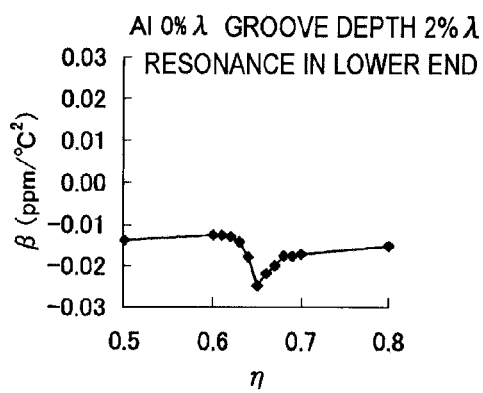
Figure 4D:
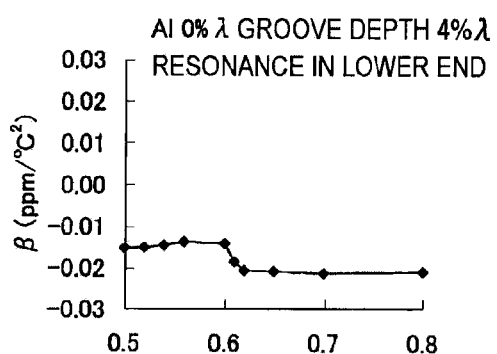

FIGS. 4A to 4D are graphs illustrating the variation of the secondary temperature coefficient β when the line occupancy η is varied and the SAW is propagated by the quartz crystal substrate 30. FIG. 4A shows the secondary temperature coefficient β in the resonance in the upper mode of the stop band when the groove depth G is 0.02λ and FIG. 4B shows the secondary temperature coefficient β in the resonance of the lower mode of the stop band when the groove depth G is 0.02λ. FIG. 4C shows the secondary temperature coefficient β in the resonance in the upper mode of the stop band when the groove depth G is 0.04λ and FIG. 4D shows the secondary temperature coefficient β in the resonance of the lower mode of the stop band when the groove depth G is 0.04λ. In the simulation shown in FIGS. 4A to 4D, the SAW is propagated in some way by the quartz crystal substrate 30 not provided with an electrode film so as to reduce the factor varying the frequency-temperature characteristic. The Euler angle (0°, 123°, ψ) is used as the cut angle of the quartz crystal 30. A value at which the absolute value of the secondary temperature coefficient β is the minimum is properly selected as the ψ.

It can be seen from FIGS. 4A to 4D that the secondary temperature coefficient β greatly varies in the vicinity of the line occupancy η of 0.6 to 0.7 in the upper mode and the lower mode of the stop band. By comparing the variation of the secondary temperature coefficient β in the lower mode of the stop band with the variation of the secondary temperature coefficient β in the upper mode of the stop band, it is possible to read the following. That is, the variation of the secondary temperature coefficient β in the lower mode of the stop band is shifted from a minus side to a greater minus side and thus the characteristic is deteriorated (the absolute value of the secondary temperature coefficient β increases). On the contrary, the variation of the secondary temperature coefficient β in the upper mode of the stop band is shifted from the minus side to a plus side and thus the characteristic is improved (the absolute value of the secondary temperature coefficient β decreases).

Accordingly, in order to obtain the excellent frequency-temperature characteristic in the SAW device, it is preferable to use the vibration in the upper mode of the stop band.

The inventor made a study of the relation between the line occupancy η and the secondary temperature coefficient β when the SAW in the upper mode of the stop band is propagated in the quartz crystal substrate with various groove depths G.

Figure 5:
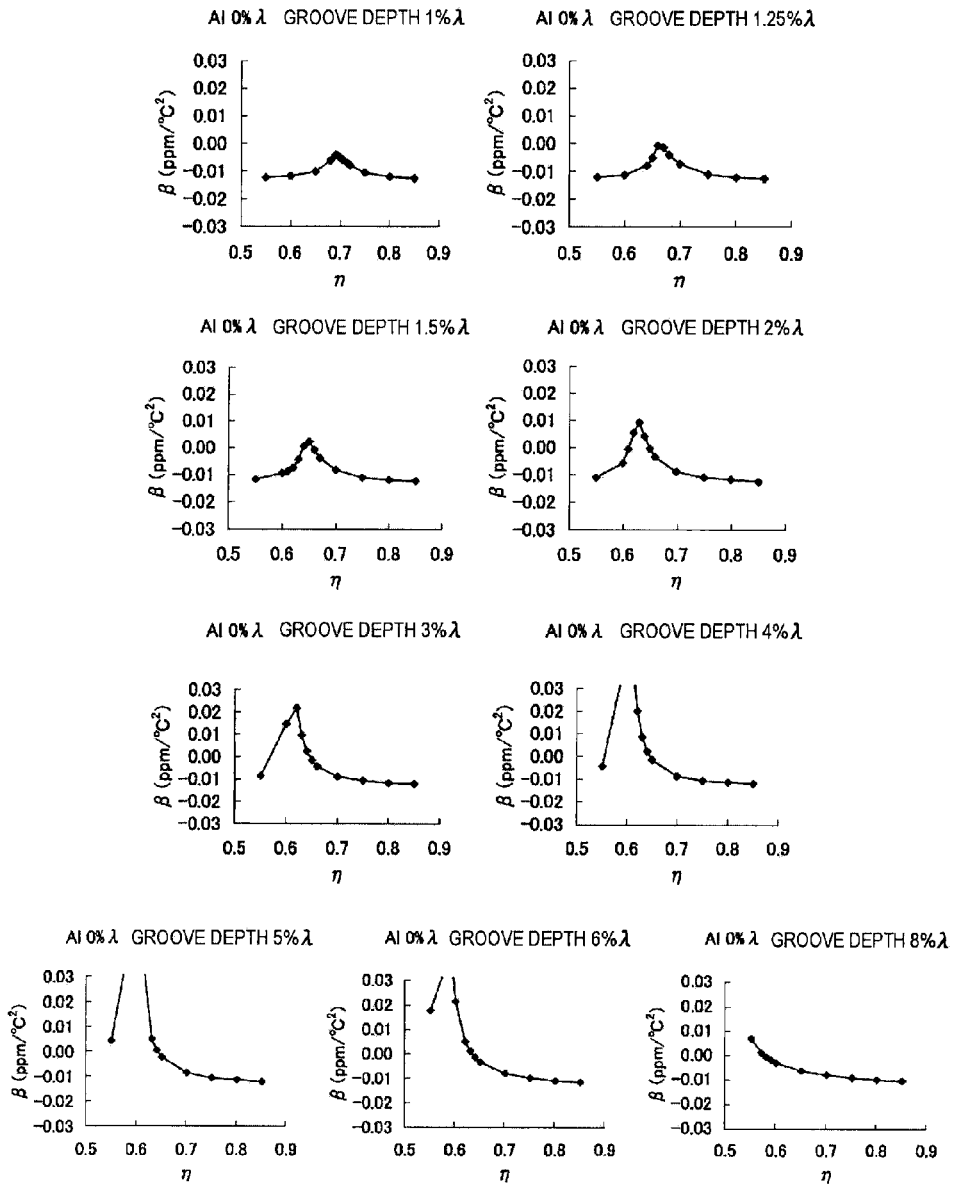
FIG. 5 shows graphs illustrating the relation between the line occupancy η and the secondary temperature coefficient β when the depth of the inter-electrode-finger groove is changed with an electrode thickness of 0.

FIG. 5 shows simulation graphs illustrating the relations between the line occupancy η and the secondary temperature coefficient β when the groove depth G is varied from 0.01λ (1% λ) to 0.08λ (8% λ). It can be seen from FIG. 5 that a point with β=0, that is, a point where the approximate curve representing the frequency-temperature characteristic is a cubic curve, first appears in the vicinity of the groove depth G of 0.0125λ (1.25% λ). It can be also seen from FIG. 5 that there are two points η with β=0 (a point (η1) with β=0 on the side where η is great and a point (η2) with β=0 on the side where η is small). It can be also seen from FIG. 5 that η2 is greater than η1 in the variation of the line occupancy η with respect to the variation of the groove depth G.

Figure 6:
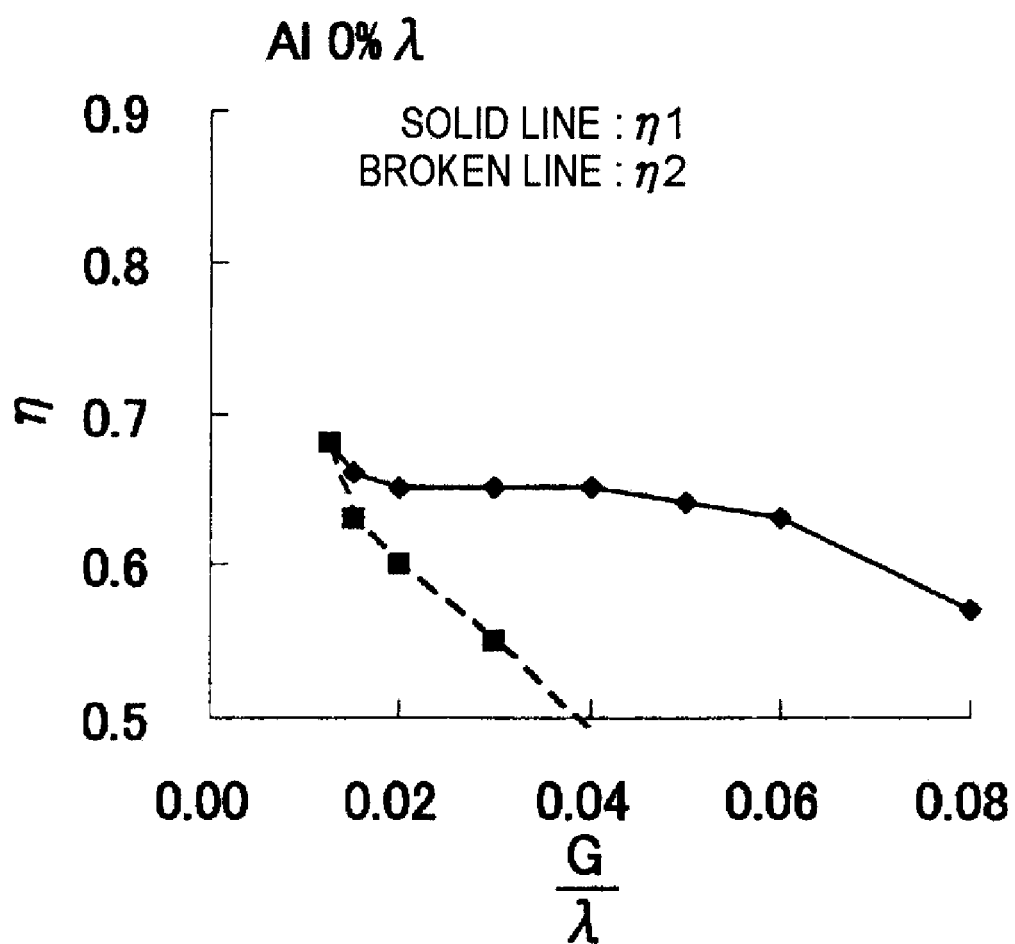
FIG. 6 shows a graph illustrating the relation between the depth of the inter-electrode-finger groove in which the secondary temperature coefficient is 0 with the electrode thickness of 0 and the line occupancy η.

This knowledge can be understood deeper with reference to FIG. 6. FIG. 6 is a graph in which η1 and η2 are plotted in which the secondary temperature coefficient β is 0 while varying the groove depth G. It can be seen from FIG. 6 that η1 and η2 decrease as the groove depth G increases, but the variation of η2 is great in the vicinity of the groove depth of G=0.04λ to such an extent that the variation departs from the graph expressed in the range of 0.5λ to 0.9λ. That is, variation of the η2 is great with respect to the variation of the groove depth G.

Figure 7:
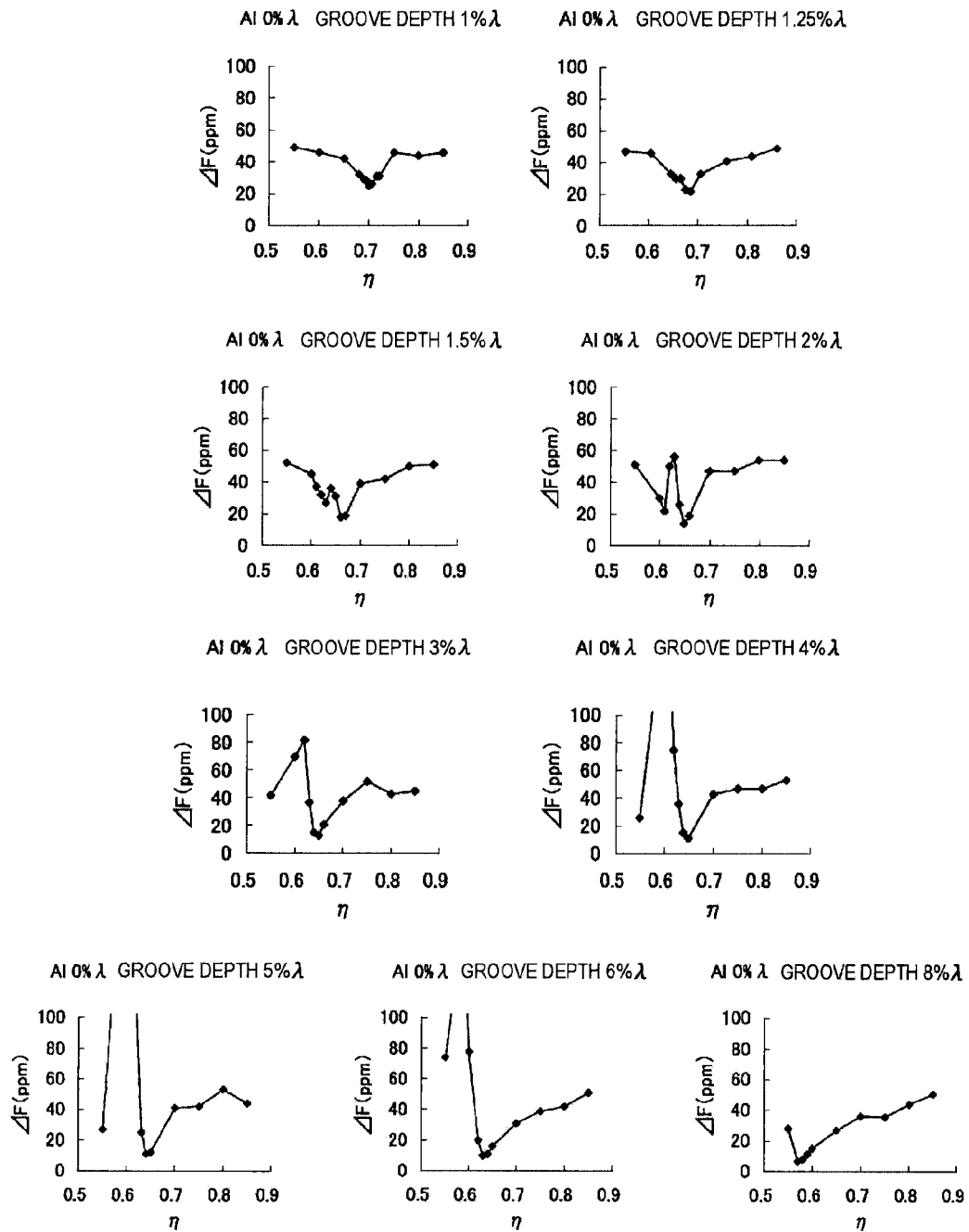
FIG. 7 shows graphs illustrating the relation between the line occupancy η and the frequency variation ΔF when the depth of the inter-electrode-finger groove is changed at an electrode thickness of 0.

FIG. 7 shows graphs in which the vertical axis of FIG. 5 is changed from the secondary temperature coefficient β to the frequency variation ΔF. It can be seen from FIG. 7 that the frequency variation ΔF is lowered at two points (η1 and η2) with β=0. It can be also seen from FIG. 7 that the frequency variation ΔF is suppressed to be small at a point corresponding to η1 in any graph with the changed grooved depth G out of two points with β=0.

Figure 3:
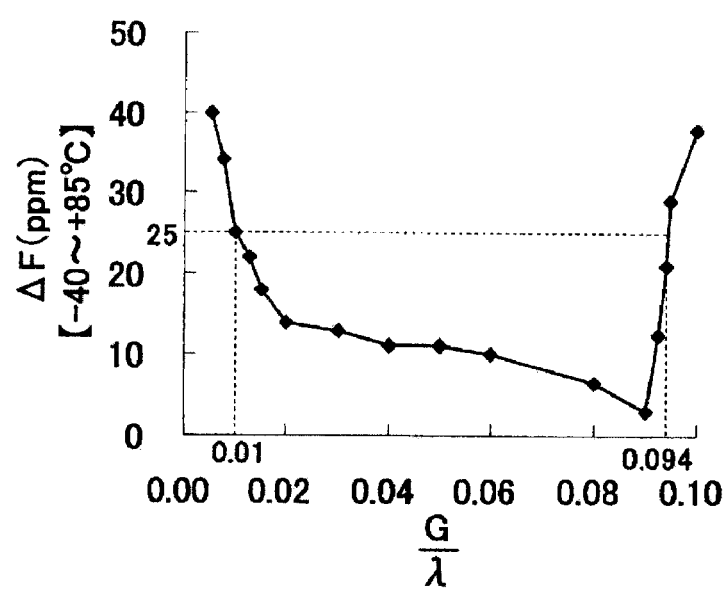
FIG. 3 is a graph illustrating the relation between the depth of an inter-electrode-finger groove and a frequency variation in an operating temperature range.

According to this tendency, it is preferable for mass products in which production errors can be easily caused that the line occupancy with a small variation of the point with β=0 relative to the variation of the groove depth G is employed, that is, that η1 is employed. FIG. 3 shows a graph illustrating the relation between the frequency variation ΔF at the point (η1) in which the secondary temperature coefficient β is the minimum and the grooved depth G. It can be seen from FIG. 3 that the lower limit of the groove depth G in which the frequency variation ΔF is equal to or less than 25 ppm as a target value is 0.01λ and the groove depth G is equal to or greater than the lower limit, that is, the groove depth range is 0.01≦G.

In FIG. 3, an example where the groove depth G is equal to or greater than 0.08λ in simulation is also shown. In the simulation, the groove depth G is equal to or greater than 0.01λ, the frequency variation ΔF is equal to or less than 25 ppm, and the frequency variation ΔF decreases as the groove depth G increases. However, when the groove depth G is equal to or greater than 0.9λ, the frequency variation ΔF increases again. When the groove depth is greater than 0.094λ, the frequency variation ΔF is greater than 25 ppm.

The graph shown in FIG. 3 is the simulation result in the state where the electrode films such as the IDT 12 and the reflectors 20 are not formed on the quartz crystal substrate 30, but it can be thought that the frequency variation ΔF of the SAW resonator 10 having the electrode films formed thereon is smaller, and the details of which can be seen from FIGS. 16 to 21. Therefore, when the upper limit of the groove depth G is determined, the maximum value in the state where the electrode films are not formed can be set, that is, G≦0.94λ. The range of the groove depth G suitable for accomplishing the goal can be expressed by the following expression (17).

$$0.01\lambda \leq G \leq 0.094\lambda \quad (17)$$

Figure 8:
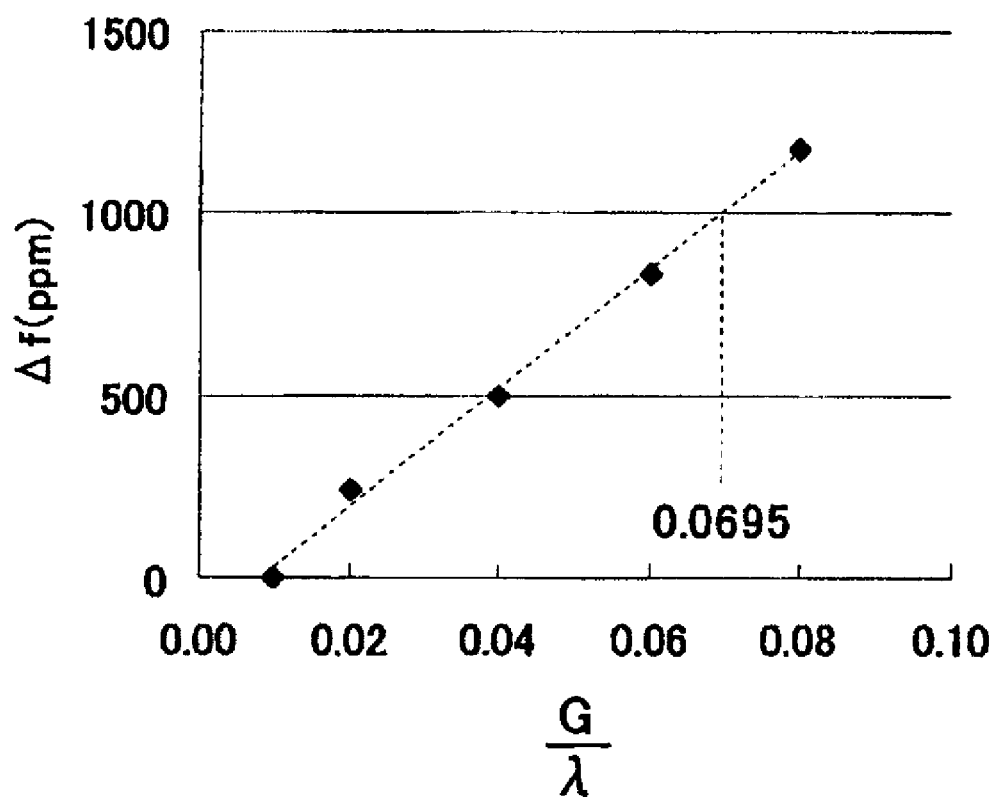
FIG. 8 is a graph illustrating the relation between the depth of a specific inter-electrode-finger groove when the depth of the inter-electrode-finger groove is deviated by ±0.001λ and a frequency difference generated in the SAW resonator with the deviation.

The groove depth G in the mass production has a tolerance of maximum about ±0.001λ. Accordingly, when the line occupancy η is constant and the groove depth G is deviated by ±0.001λ, the frequency variation ΔF of each SAW resonator 10 is shown in FIG. 8. It can be seen from FIG. 8 that when the groove depth G is deviated by ±0.001λ in G=0.04λ, that is, when the groove depth is in the range of 0.039λ≦G≦0.041λ, the frequency variation ΔF is about ±500 ppm.

Here, when the frequency variation ΔF is less than ±1000 ppm, the frequency can be adjusted by the use of various means for finely adjusting the frequency. However, when the frequency variation ΔF is equal to or greater than ±1000 ppm, the static characteristic such as the Q value and the CI (Crystal Impedance) value and the long-term reliability are affected by the frequency adjustment, whereby the good production rate of the SAW resonator 10 is deteriorated.

By deriving an approximate expression representing the relation between the frequency variation ΔF [ppm] and the groove depth G from the straight line connecting the plots shown in FIG. 8, the following expression (18) can be obtained.

$$\Delta F = 16334G - 137 \quad (18)$$

Here, the range of G satisfying ΔF<1000 ppm is G≦0.0695λ. Therefore, the range of the groove depth G according to this embodiment is preferably expressed by the following expression (19).

$$0.01\lambda \leq G \leq 0.0695\lambda \quad (19)$$

Figure 9:
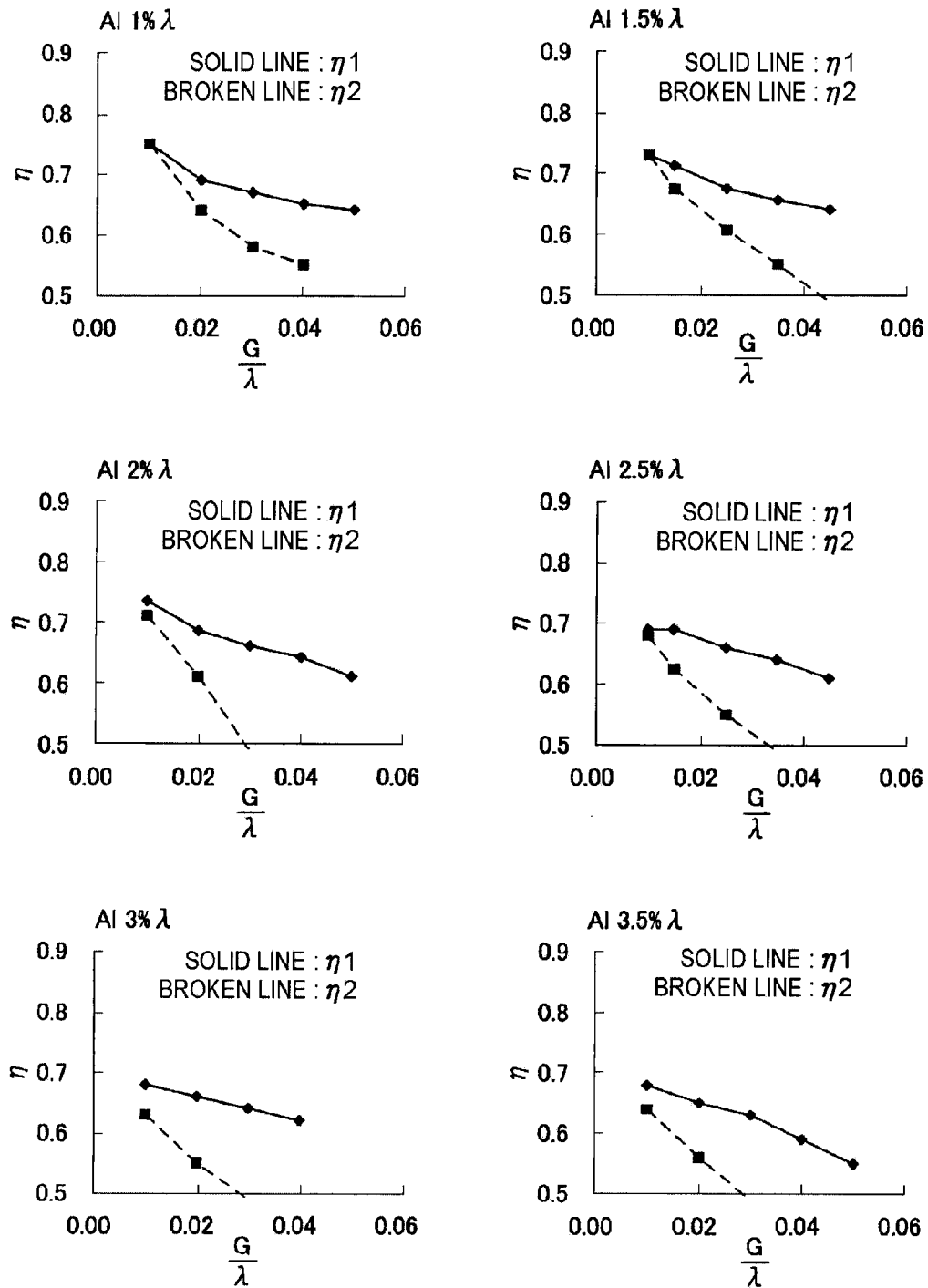
FIG. 9 shows graphs illustrating the relation between the depth of the inter-electrode-finger groove at the secondary temperature coefficient of 0 and the line occupancy η when the electrode thickness is changed.
Figure 24:
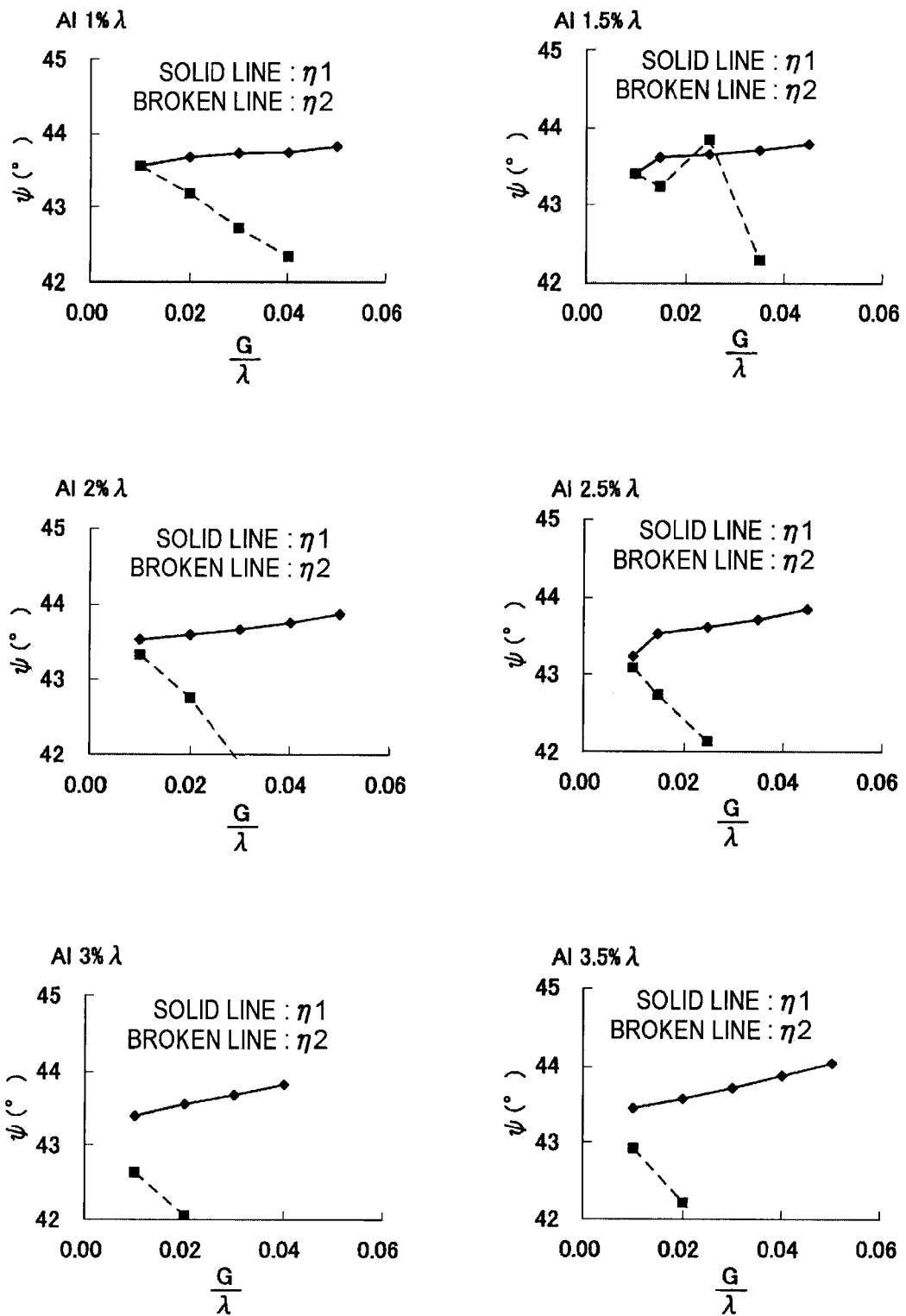
FIG. 24 shows graphs illustrating the relations between the depth of the inter-electrode-finger groove and the Euler angle ψ when the electrode thickness and the line occupancy η are determined.

FIG. 9 shows graphs illustrating the relation between η with the secondary temperature coefficient of β=0, that is, the line occupancy η representing a tertiary temperature characteristic, and the groove depth G. The quartz crystal substrate 30 has the Euler angle of (0°, 123°, ψ). Here, an angle at which the frequency-temperature characteristic shows the tendency of the cubic curve, that is, an angle at which the secondary temperature coefficient is β=0, is properly selected as ψ. The relations between the Euler angle ψ at which η with β=0 is obtained and the groove depth G under the same condition as shown in FIG. 9 are shown in FIG. 24. In the graph with the electrode thickness of H=0.02λ in FIG. 24, the plot of ψ<42° is not shown, but ψ=41.9° at G=0.03λ is shown in the plot of η2 of the graph. The plot of the relation between the groove depth G at each electrode thickness and the line occupancy η is obtained from FIGS. 12 to 17 the details of which are described later.

Figure 10:
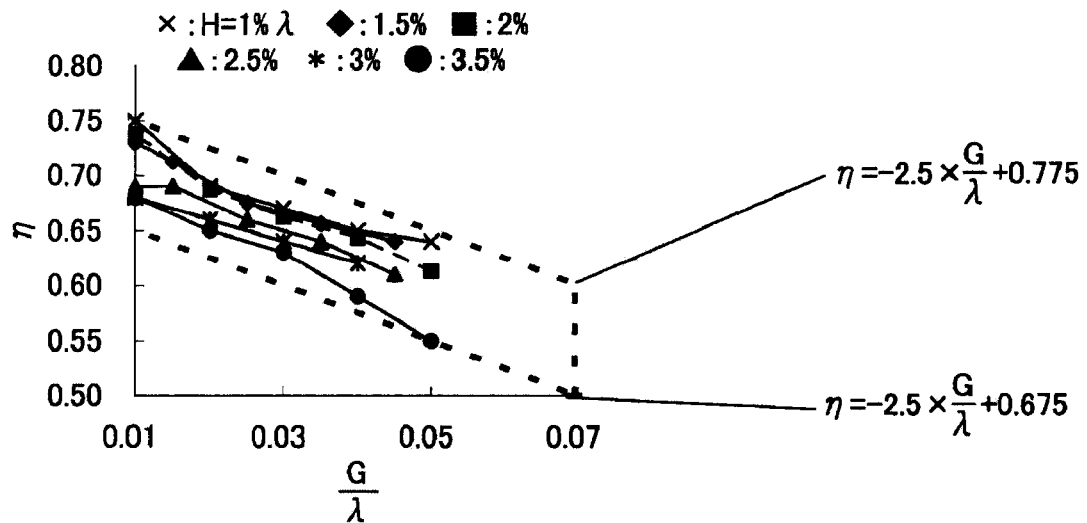
FIG. 10 is a diagram in which the relations between η1 in which the secondary temperature coefficient is 0 for each electrode thickness and the depth of the inter-electrode-finger groove are arranged in a graph.

It can be seen from FIG. 9 that the variation of η1 due to the variation of the groove depth G is smaller than the variation of η2 with any thickness, as described above. Accordingly, η1 is extracted from the graph of thicknesses in FIG. 9 and is arranged in FIG. 10. It can be seen from FIG. 10 that η1 is concentrated in the line indicated by a broken line. In FIG. 10, the plot indicating the upper limit of the line occupancy η represents the SAW resonator with the electrode thickness of H=0.01λ and the plot indicating the lower limit of the line occupancy η represents the SAW resonator with the electrode thickness of H=0.035λ. That is, as the electrode thickness H increases, the line occupancy η in which the secondary temperature coefficient is β=0 decreases.

By calculating the approximate expression of the plot indicating the upper limit of the line occupancy η and the plot indicating the lower limit of the line occupancy η on the basis of the above description, the following expressions (20) and (21) can be derived.

$$\eta = -2.5 \times G/\lambda + 0.775 \quad (20)$$

$$\eta = -2.5 \times G/\lambda + 0.675 \quad (21)$$

It can be said from the above expressions (20) and (21) that η in the range surrounded with the broken line in FIG. 10 can be determined in the range expressed by the following expression (22).

$$-2.5 \times G/\lambda + 0.675 \leq \eta \leq -2.5 \times G/\lambda + 0.775 \quad (22)$$

Here, when the secondary temperature coefficient β is permitted within ±0.01 ppm/° C.², it is confirmed that expressions (19) and (22) are both satisfied and thus the secondary temperature coefficient β is in the range of ±0.01 ppm/° C.².

Figure 11:
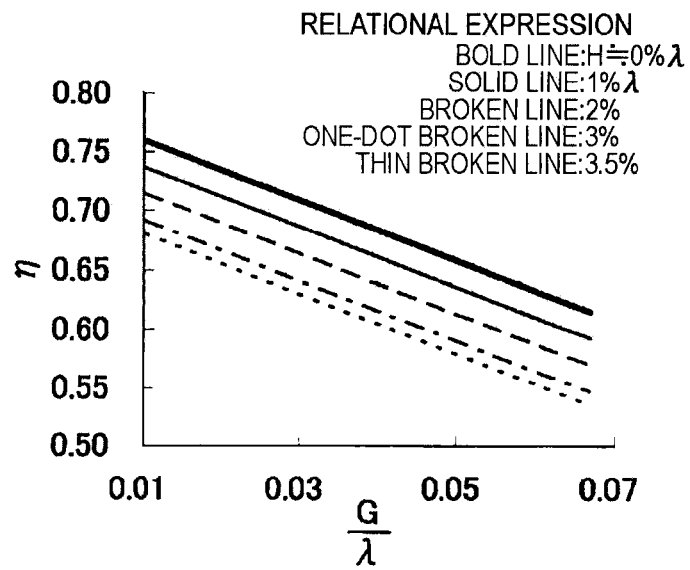
FIG. 11 is a diagram in which the relations between the depth of the inter-electrode-finger groove and the line occupancy η are approximated to straight lines while changing the electrode thickness from H≈0 to H=0.035λ.

When the relations between the groove depth G with β=0 and the line occupancy η in the SAW resonators 10 with the electrode thickness of H≈0, 0.01λ, 0.02λ, 0.03λ, and 0.035λ are expressed by the approximate straight line on the basis of the expressions (20) to (22), the straight lines shown in FIG. 11 are obtained. The relations between the groove depth G and the line occupancy η in the quartz crystal substrate 30 not having an electrode film formed thereon are as shown in FIG. 6.

The relational expression between the groove depth G and the line occupancy η in which the frequency-temperature characteristic is excellent can be expressed by the following expression (23) on the basis of the approximate expressions indicating the approximate straight lines with the electrode thicknesses H.

$$\eta = -2.533 \times G/\lambda - 2.269 \times H/\lambda + 0.785 \quad (23)$$

As for the line occupancy η, the production tolerance of the electrical characteristic (particularly, the resonance frequency) increases as the electrode thickness increases. Accordingly, a production tolerance of ±0.04 or less can occur when the electrode thickness H is in the range expressed by expression (14), and a production tolerance greater than ±0.04 can occur when the electrode thickness is in the range of H>0.035λ. However, when the electrode thickness H is in the range expressed by the expression (23) and the tolerance of the line occupancy η is ±0.04 or less, it is possible to embody a SAW device with a small secondary temperature coefficient β. That is, when the secondary temperature coefficient β is set to ±0.01 ppm/° C.² or less in consideration of the production tolerance of the line occupancy, the line occupancy η can be extended to the range expressed by the following expression (24) which is obtained by adding the tolerance of ±0.04 to the expression (23).

$$\eta = -2.533 \times G/\lambda - 2.269 \times H/\lambda + 0.785 + 0.04 \quad (23)$$

Graphs illustrating the relations between the line occupancy η and the secondary temperature coefficient β when the electrode thickness is changed to 0.01λ (1% λ), 0.015λ (1.5% λ), 0.02λ (2% λ), 0.025λ (2.5% λ), 0.03λ (3% λ), and 0.035λ (3.5% λ) and the groove depth G is changed are shown in FIGS. 12 to 17.

Graphs illustrating the relations between the line occupancy η and the frequency variation ΔF in the SAW resonators 10 corresponding to FIGS. 12 to 17 are shown in FIGS. 18 to 23. All the quartz crystal substrates have the Euler angle of (0°, 123°, ψ) and an angle at which ΔF is the minimum is properly selected as ψ.

Figure 12:
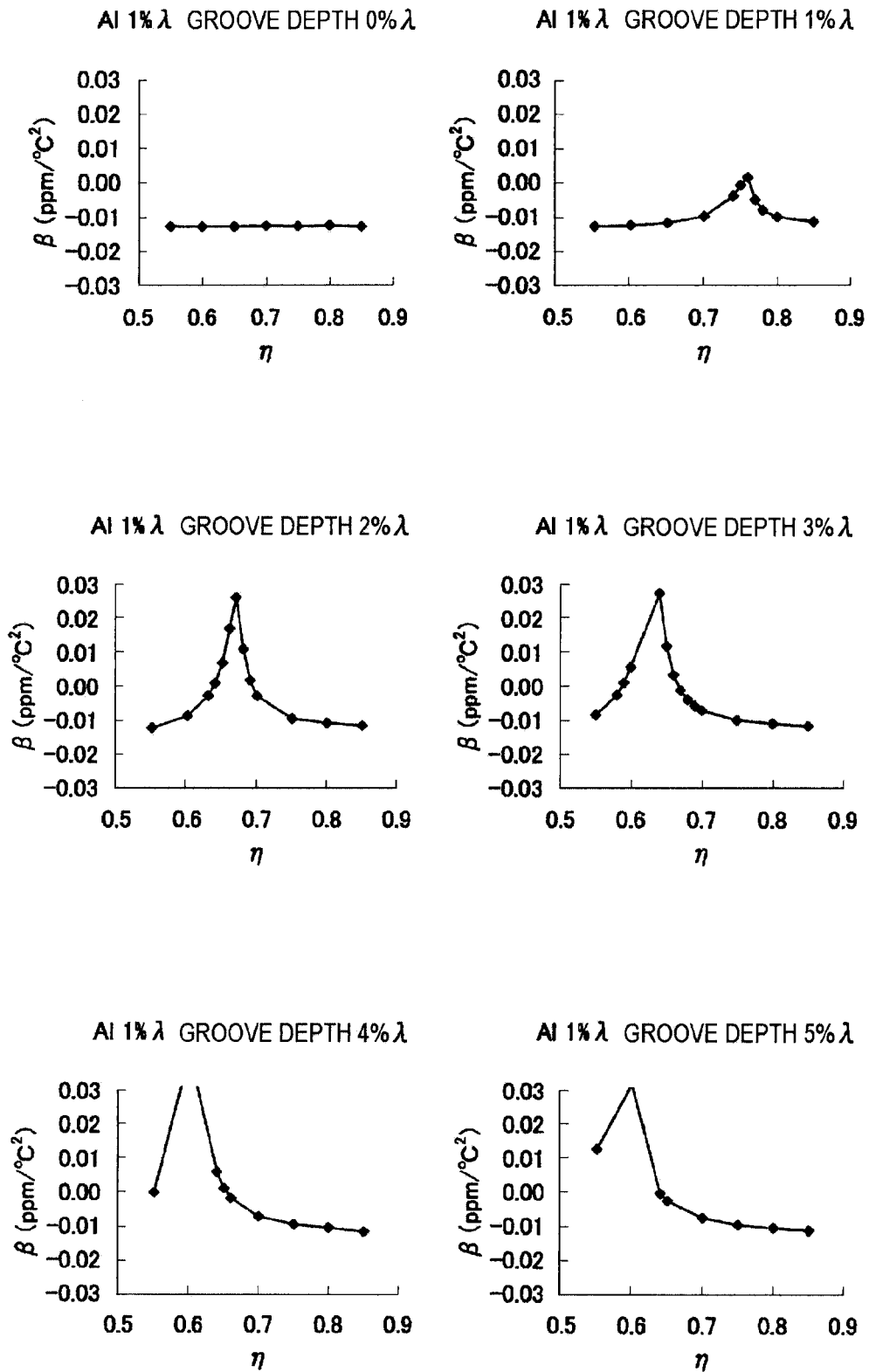
FIG. 12 shows graphs illustrating the relations between the line occupancy η and the secondary temperature coefficient β when the depth of the inter-electrode-finger groove is changed with the electrode thickness of 0.01λ.
Figure 18:
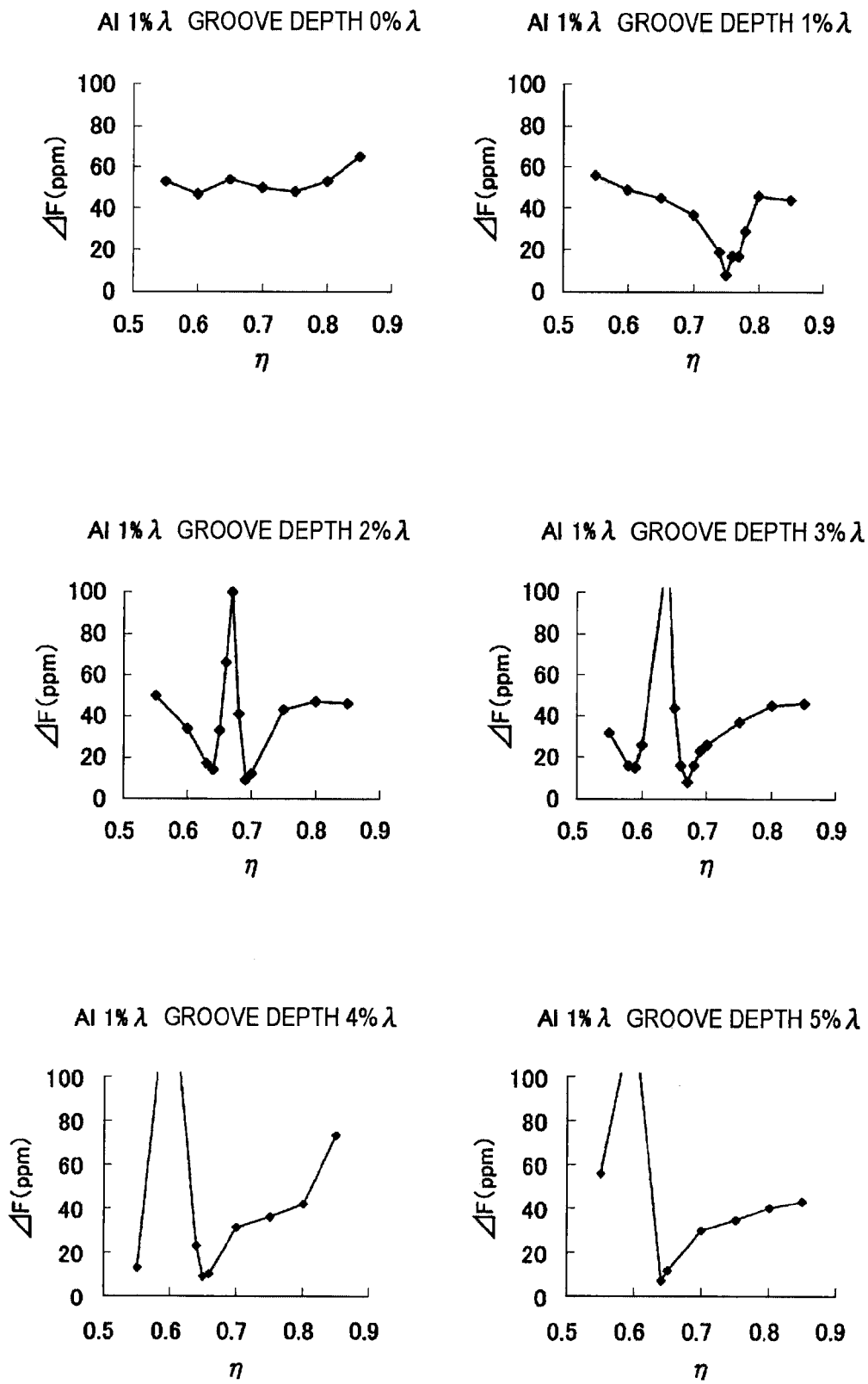
FIG. 18 shows graphs illustrating the relations between the line occupancy η and the frequency variation ΔF when the depth of the inter-electrode-finger groove is changed with the electrode thickness of 0.01λ.

Here, FIG. 12 is a diagram illustrating the relation between the line occupancy η and the secondary temperature coefficient β when the electrode thickness H is 0.01λ and FIG. 18 is a diagram illustrating the relation between the line occupancy η and the frequency variation ΔF when the electrode thickness H is 0.01λ.

Figure 13:
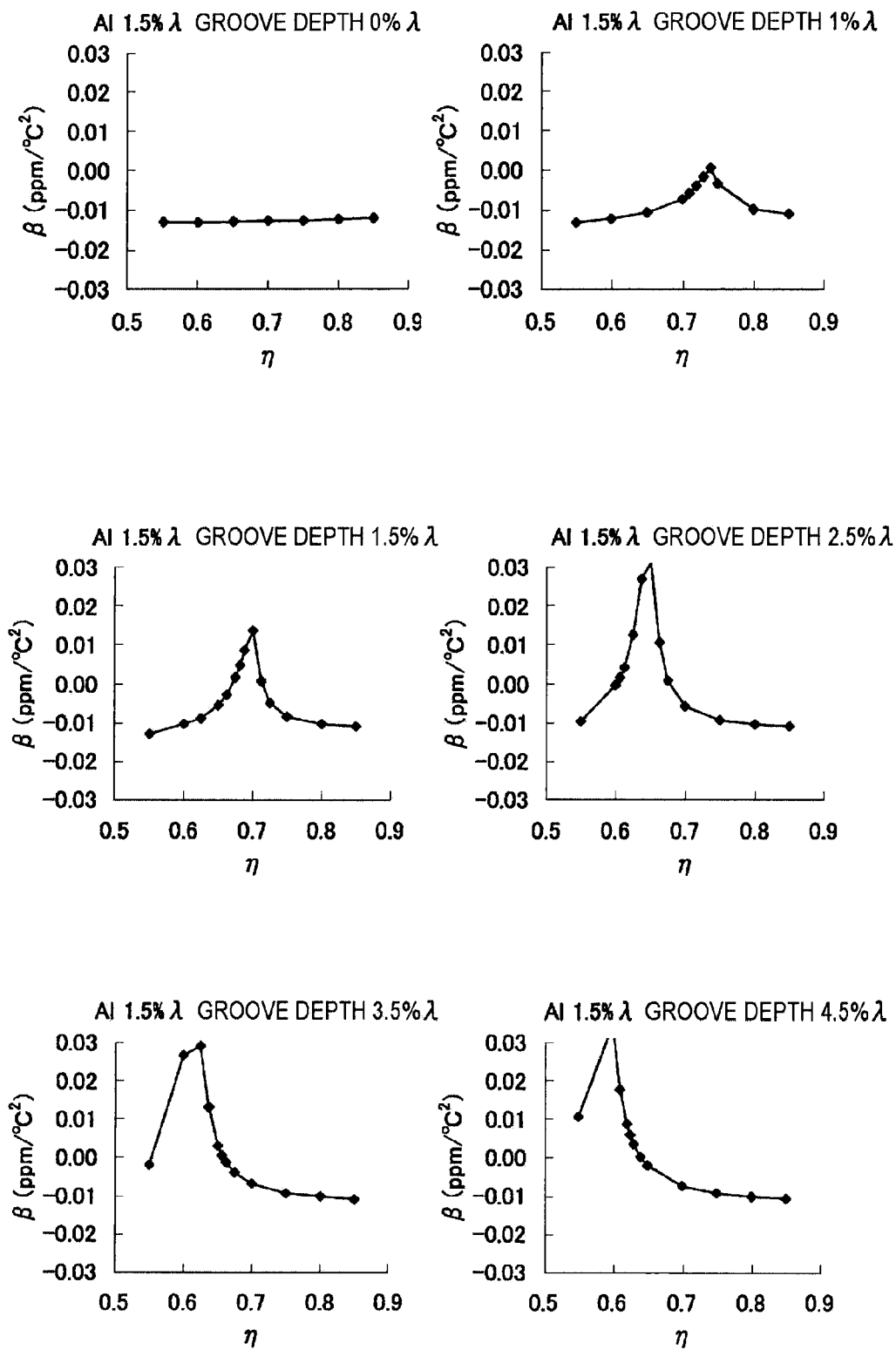
FIG. 13 shows graphs illustrating the relations between the line occupancy η and the secondary temperature coefficient β when the depth of the inter-electrode-finger groove is changed with the electrode thickness of 0.015λ.
Figure 19:
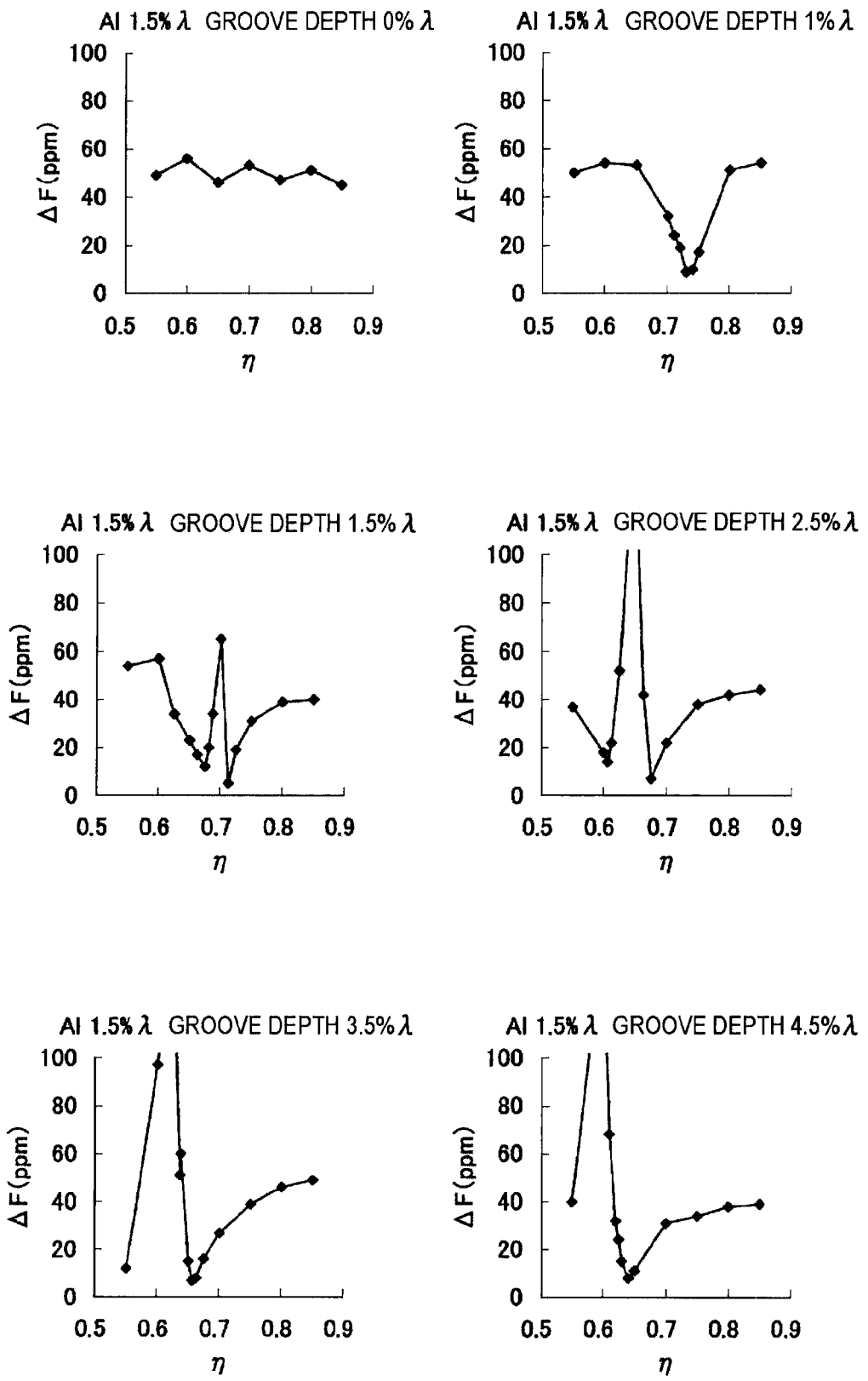
FIG. 19 shows graphs illustrating the relations between the line occupancy η and the frequency variation ΔF when the depth of the inter-electrode-finger groove is changed with the electrode thickness of 0.015λ.

FIG. 13 is a diagram illustrating the relation between the line occupancy η and the secondary temperature coefficient β when the electrode thickness H is 0.015λ and FIG. 19 is a diagram illustrating the relation between the line occupancy η and the frequency variation ΔF when the electrode thickness H is 0.015λ.

Figure 14:
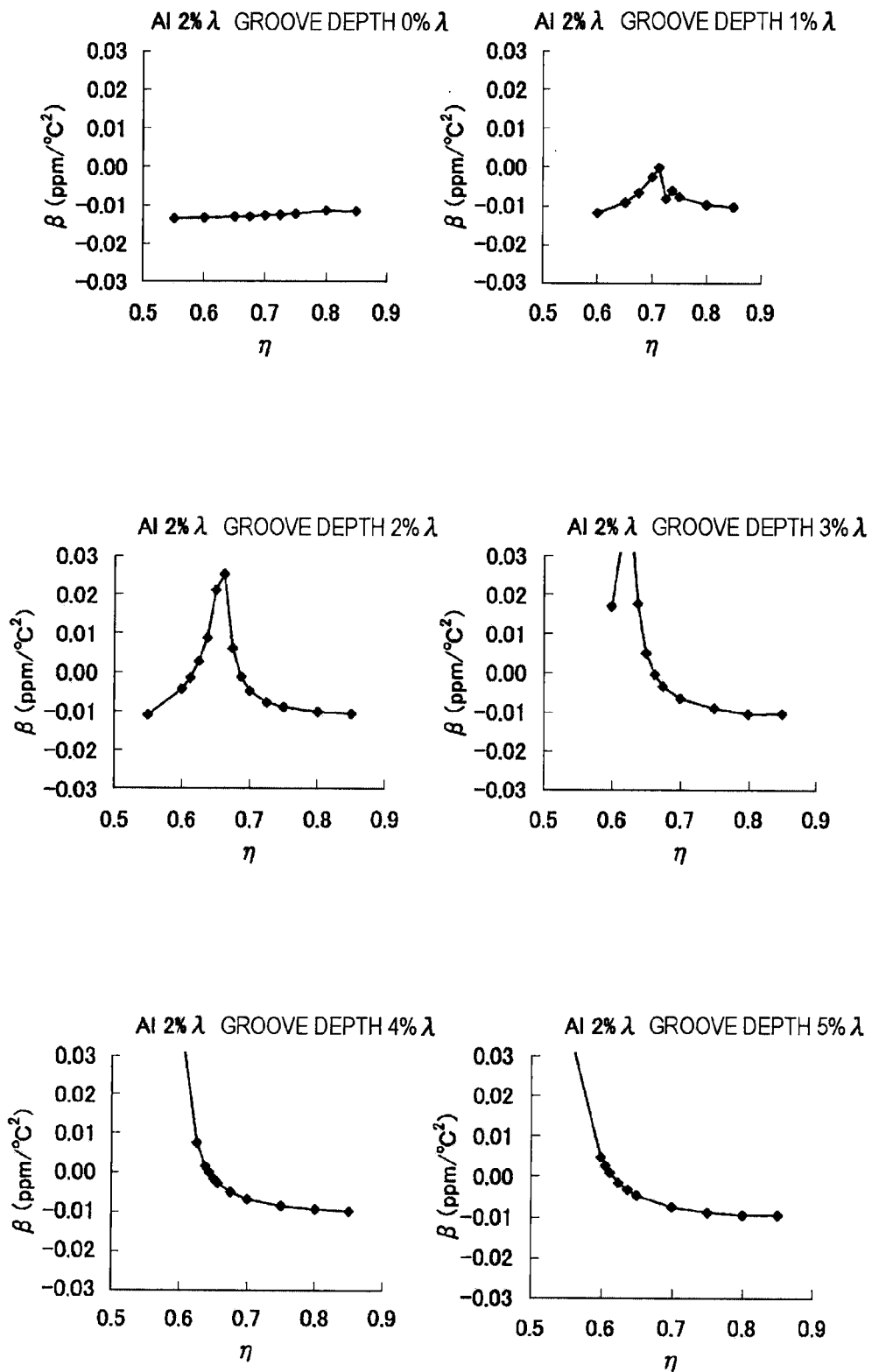
FIG. 14 shows graphs illustrating the relations between the line occupancy η and the secondary temperature coefficient β when the depth of the inter-electrode-finger groove is changed with the electrode thickness of 0.02λ.
Figure 20:
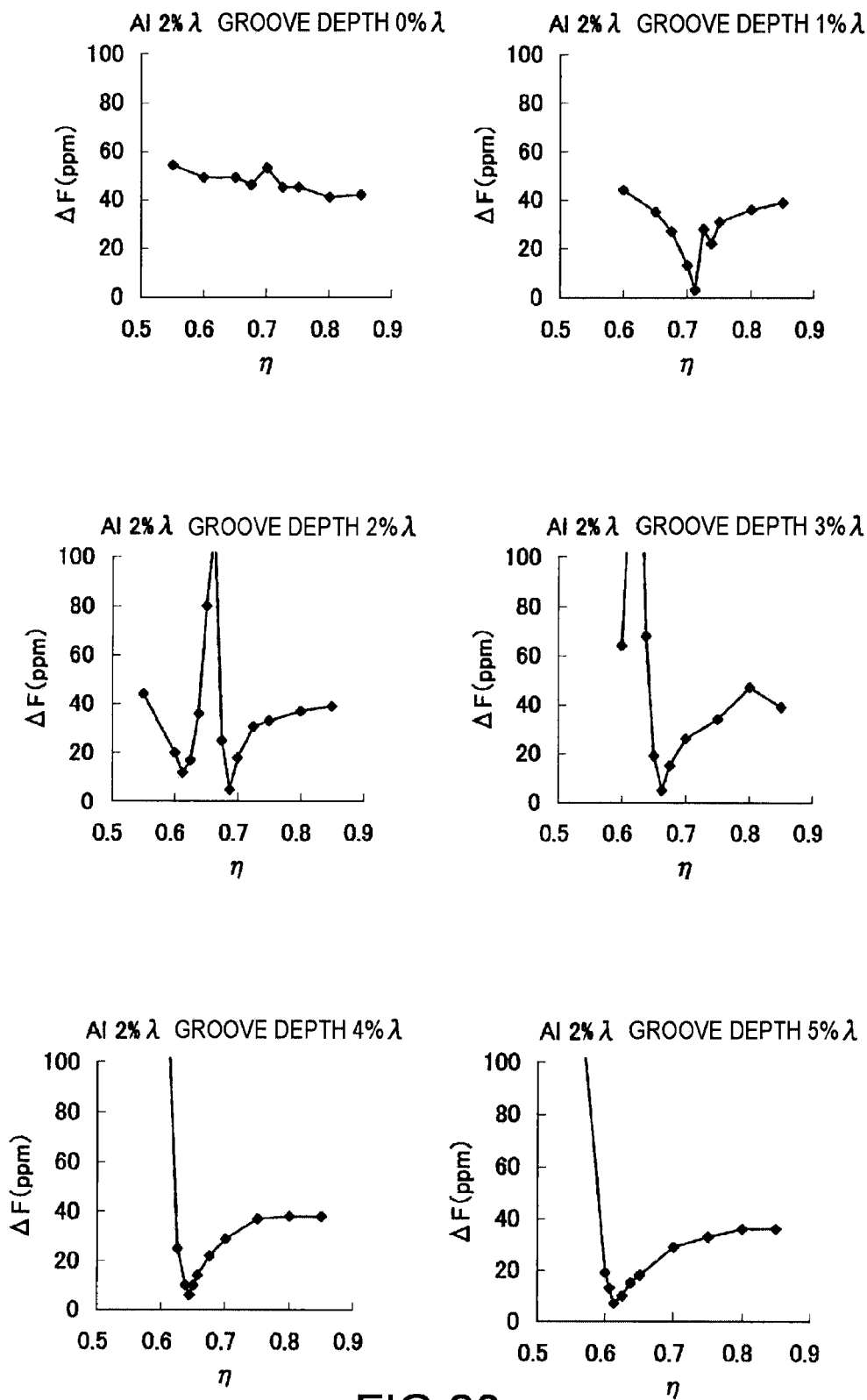
FIG. 20 shows graphs illustrating the relations between the line occupancy η and the frequency variation ΔF when the depth of the inter-electrode-finger groove is changed with the electrode thickness of 0.02λ.

FIG. 14 is a diagram illustrating the relation between the line occupancy η and the secondary temperature coefficient β when the electrode thickness H is 0.02λ and FIG. 20 is a diagram illustrating the relation between the line occupancy η and the frequency variation ΔF when the electrode thickness H is 0.02λ.

Figure 15:
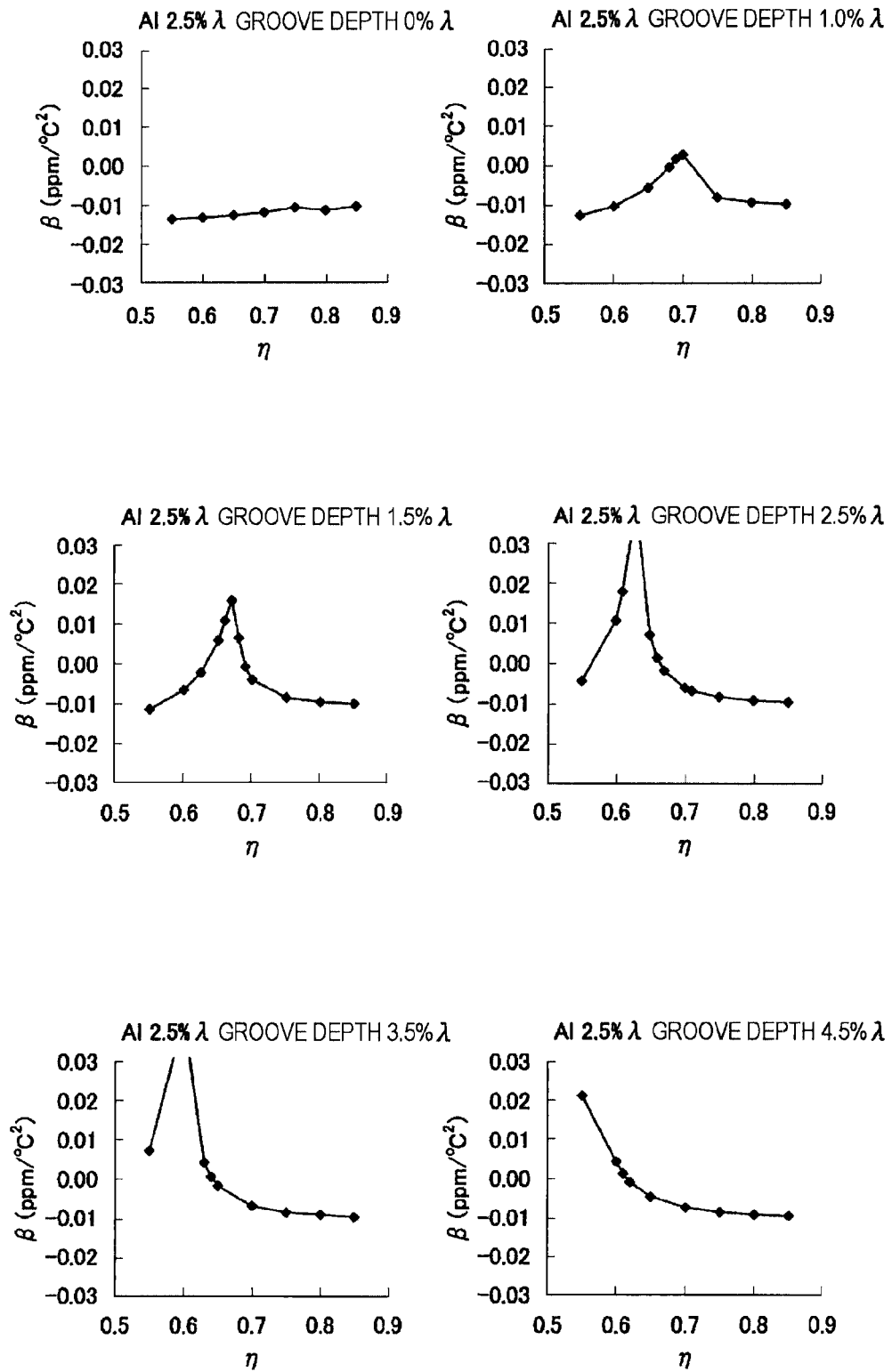
FIG. 15 shows graphs illustrating the relations between the line occupancy η and the secondary temperature coefficient β when the depth of the inter-electrode-finger groove is changed with the electrode thickness of 0.025λ.
Figure 21:
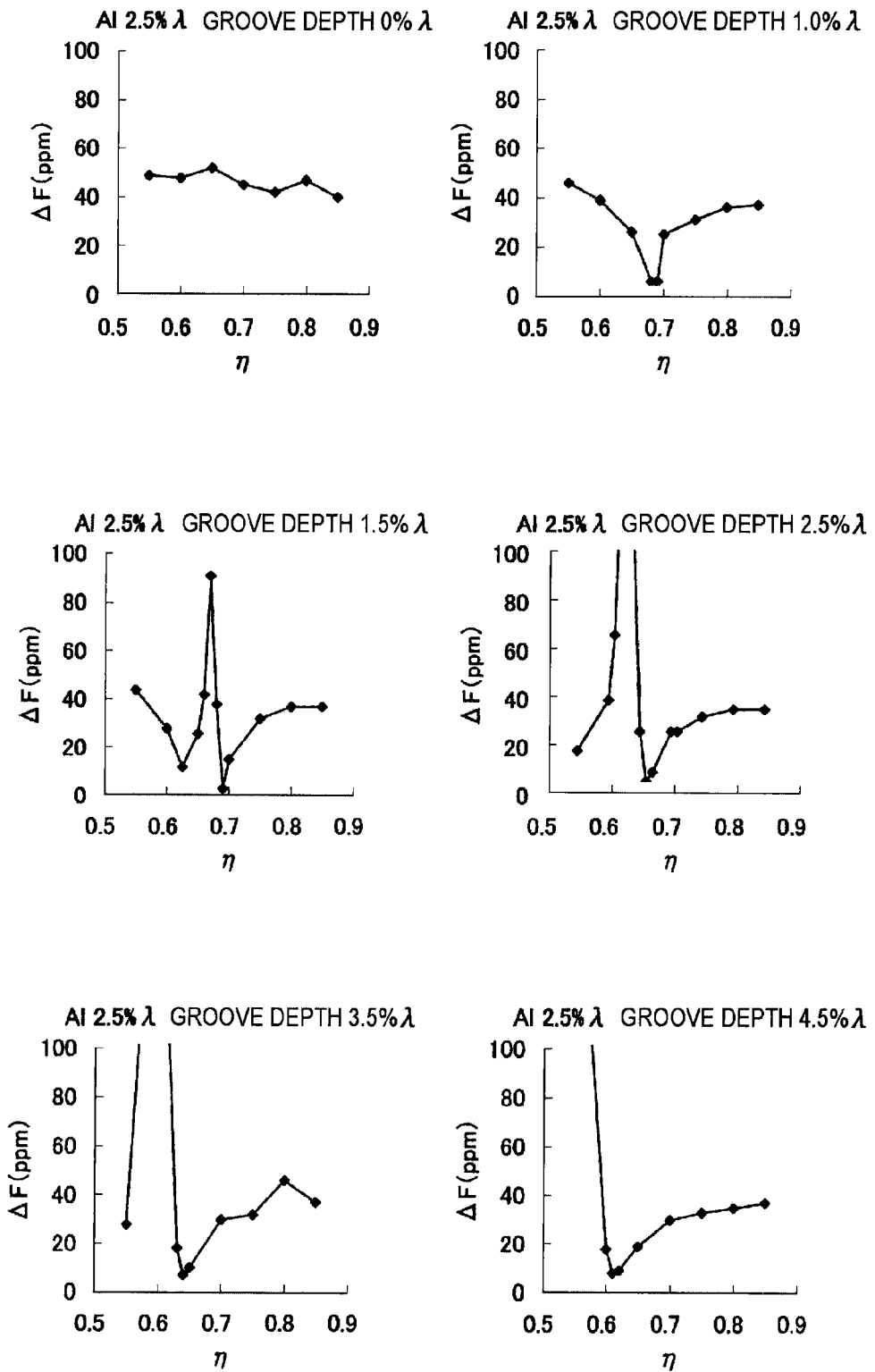
FIG. 21 shows graphs illustrating the relations between the line occupancy η and the frequency variation ΔF when the depth of the inter-electrode-finger groove is changed with the electrode thickness of 0.025λ.

FIG. 15 is a diagram illustrating the relation between the line occupancy η and the secondary temperature coefficient β when the electrode thickness H is 0.025λ and FIG. 21 is a diagram illustrating the relation between the line occupancy η and the frequency variation ΔF when the electrode thickness H is 0.025λ.

Figure 16:
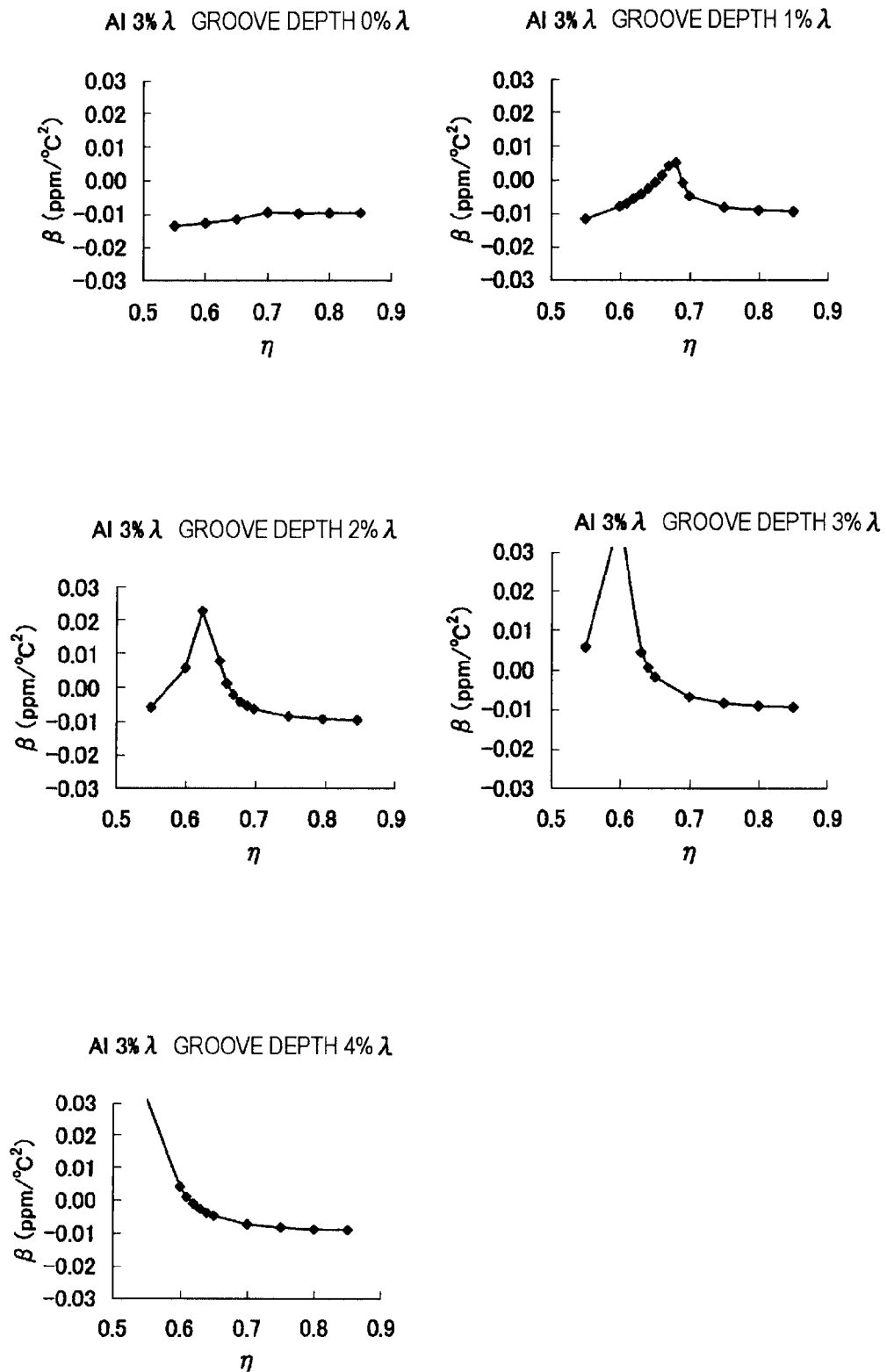
FIG. 16 shows graphs illustrating the relations between the line occupancy η and the secondary temperature coefficient β when the depth of the inter-electrode-finger groove is changed with the electrode thickness of 0.03λ.
Figure 22:
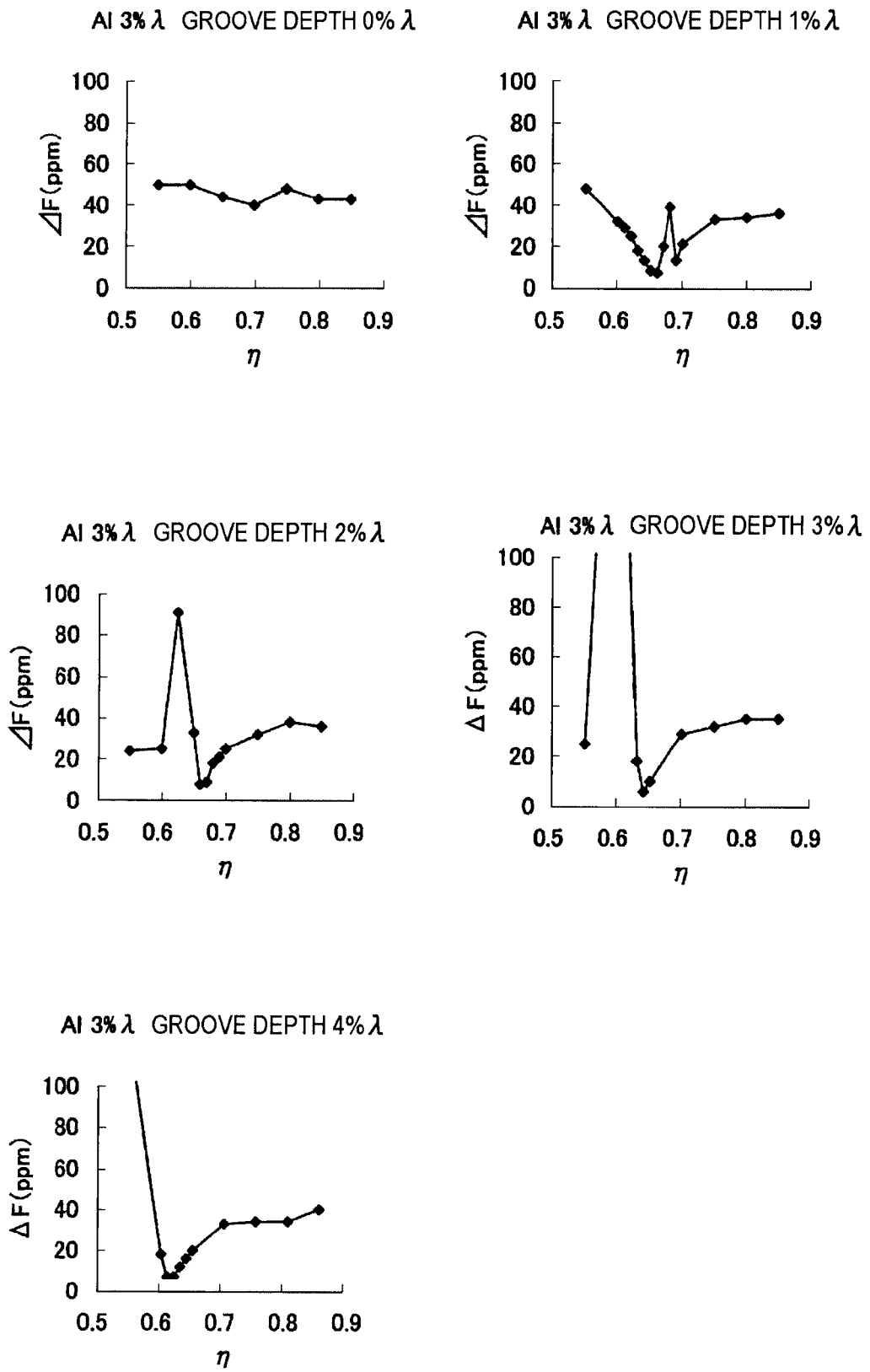
FIG. 22 shows graphs illustrating the relations between the line occupancy η and the frequency variation ΔF when the depth of the inter-electrode-finger groove is changed with the electrode thickness of 0.03λ.

FIG. 16 is a diagram illustrating the relation between the line occupancy η and the secondary temperature coefficient β when the electrode thickness H is 0.03λ and FIG. 22 is a diagram illustrating the relation between the line occupancy η and the frequency variation ΔF when the electrode thickness H is 0.03λ.

Figure 17:
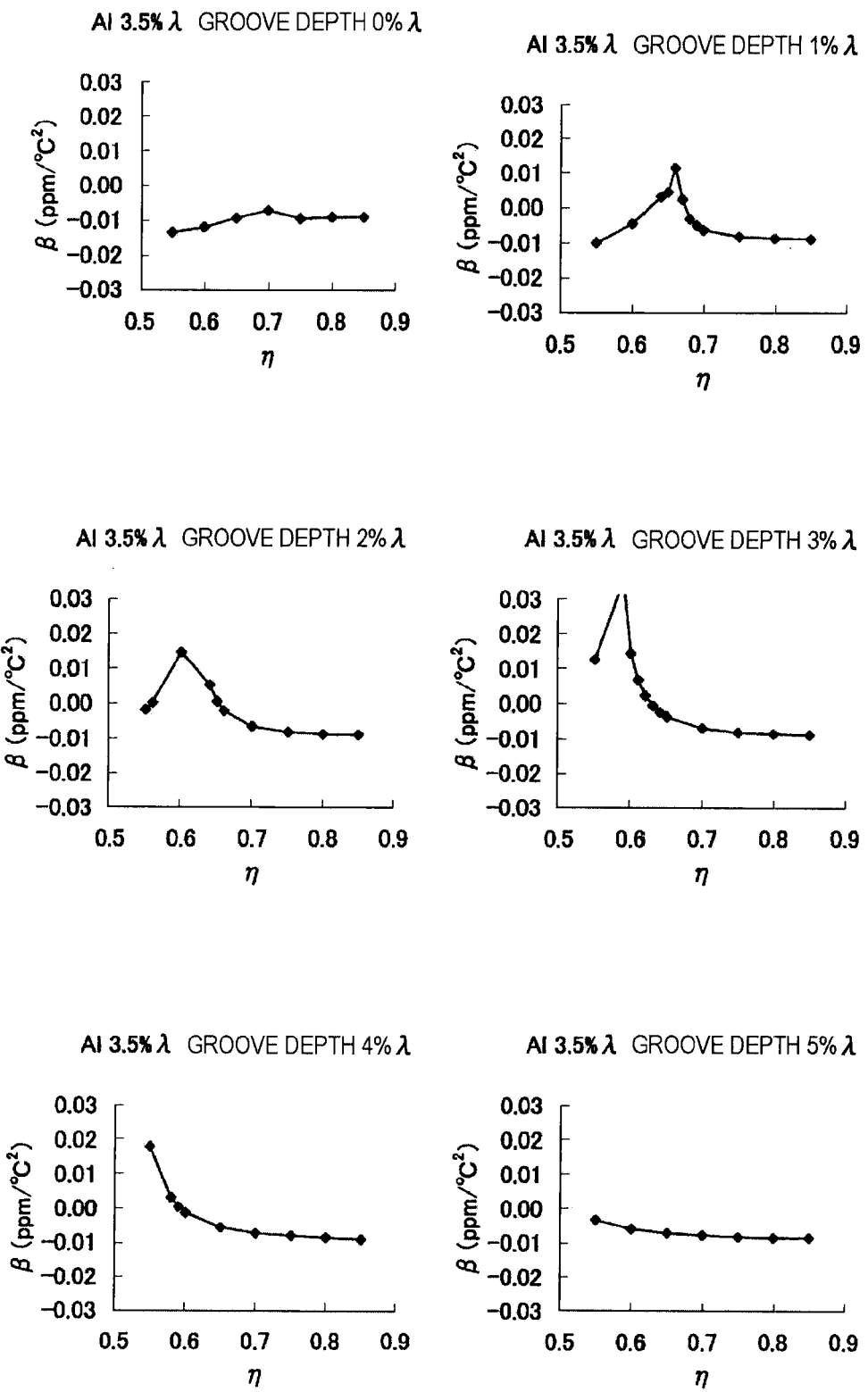
FIG. 17 shows graphs illustrating the relations between the line occupancy η and the secondary temperature coefficient β when the depth of the inter-electrode-finger groove is changed with the electrode thickness of 0.035λ.
Figure 23:
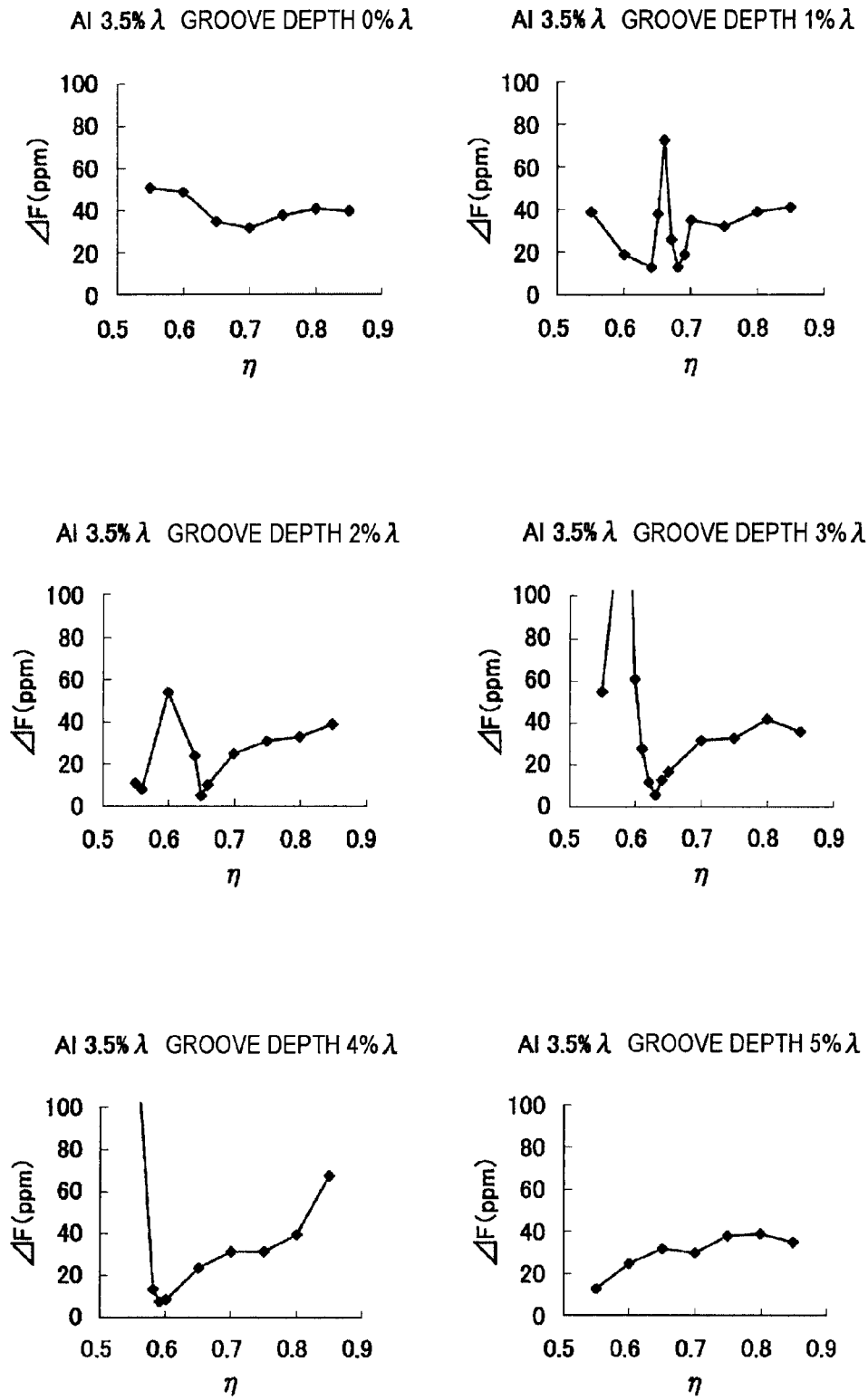
FIG. 23 shows graphs illustrating the relations between the line occupancy η and the frequency variation ΔF when the depth of the inter-electrode-finger groove is changed with the electrode thickness of 0.035λ.

FIG. 17 is a diagram illustrating the relation between the line occupancy η and the secondary temperature coefficient β when the electrode thickness H is 0.035λ and FIG. 23 is a diagram illustrating the relation between the line occupancy η and the frequency variation ΔF when the electrode thickness H is 0.035λ.

In the drawings (FIGS. 12 to 23), a minute difference exists in the graphs, but it can be seen that the variation tendency is similar to FIGS. 5 and 7 which are the graphs illustrating the relations between the line occupancy η and the secondary temperature coefficient β and between the line occupancy η and the frequency variation ΔF only in the quartz crystal substrate 30.

That is, it can be said that the advantage of this embodiment can be obtained in the propagation of the surface acoustic wave only in the quartz crystal substrate 30 excluding the electrode films.

Figure 25:
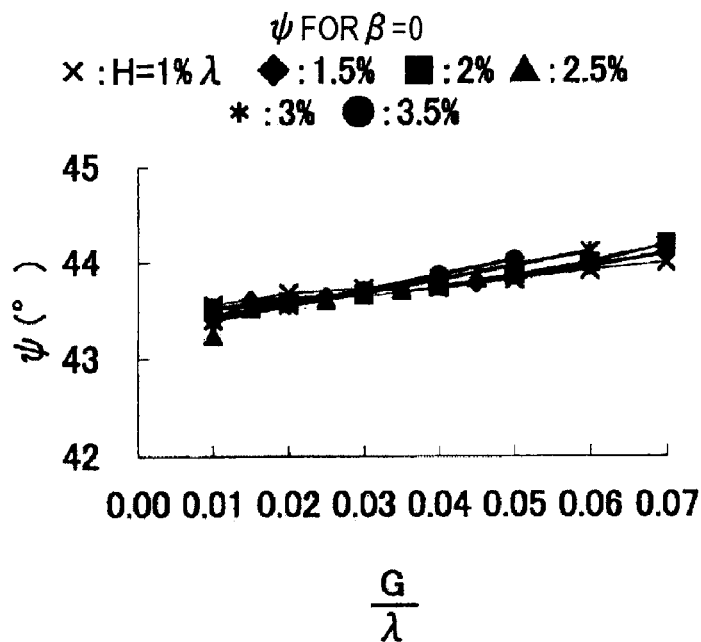
FIG. 25 is a diagram in which the relations between the depth of the inter-electrode-finger groove and the Euler angle ψ when the electrode thickness is changed are arranged in a graph.

The relations between ψ acquired from η1 in the graphs shown in FIG. 24 and the groove depth G are arranged in FIG. 25. The reason for selecting η1 is as described above. As shown in FIG. 25, even when the electrode thickness is changed, it can be seen that the angle of ψ is hardly changed and the optimal angle of ψ varies with the variation of the groove depth G. This proves that the variation of the secondary temperature coefficient β is greatly affected by the shape of the quartz crystal substrate 30.

Figure 26:
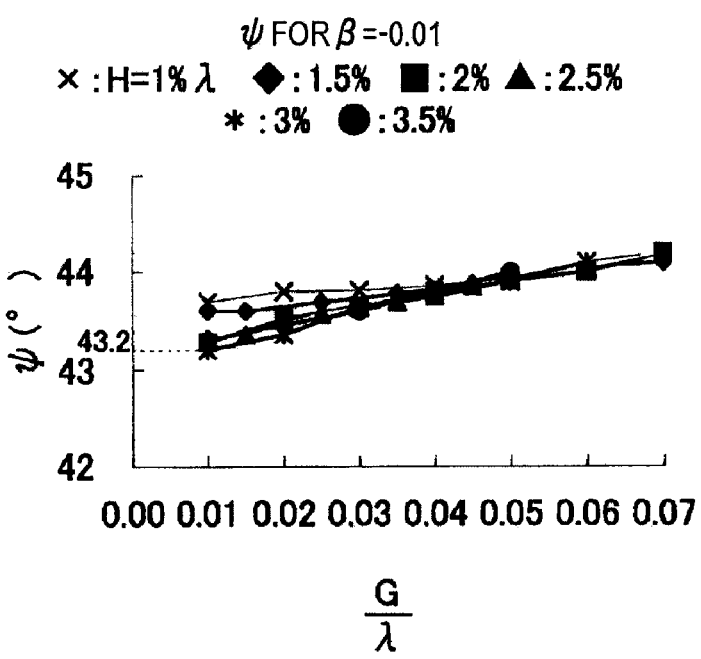
FIG. 26 is a graph illustrating the relation between the depth of the inter-electrode-finger groove and the Euler angle ψ when the secondary temperature coefficient β is −0.01 ppm/° C.².
Figure 27:
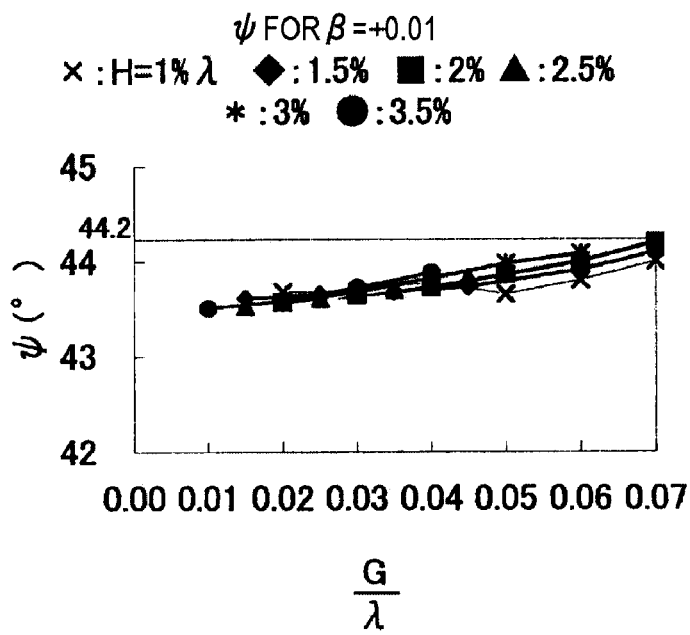
FIG. 27 is a graph illustrating the relation between the depth of the inter-electrode-finger groove and the Euler angle ψ when the secondary temperature coefficient β is +0.01 ppm/° C.².

In the same way as described above, the relations of the groove depth G to ψ at which the secondary temperature coefficient is β=−0.01 ppm/° C.$^2$ and ψ at which the secondary temperature coefficient is β=+0.01 ppm/° C.$^2$ are acquired and arranged in FIGS. 26 and 27. When the angle of ψ satisfying −0.01≦β≦+0.01 is calculated from the graphs (FIGS. 25 to 27), the angle range of ψ under the above-mentioned condition can be determined preferably as 43°≦ψ≦45° and more preferably as 43.2°≦ψ≦44.2°.

Figure 28:
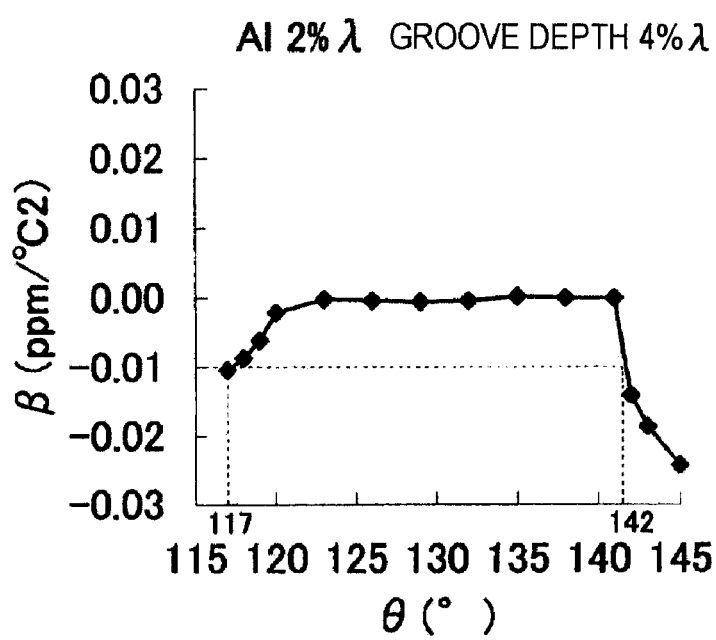
FIG. 28 is a graph illustrating the relation between the Euler angle θ and the secondary temperature coefficient β when the electrode thickness is 0.02λ and the depth of the inter-electrode-finger groove is 0.04λ.

The variation of the secondary temperature coefficient β when the angle of η is given, that is, the relation between θ and the secondary temperature coefficient β, is shown in FIG. 28. Here, the SAW device used in the simulation includes a quartz crystal substrate in which the cut angle and the SAW propagation direction are expressed by the Euler angle (0, θ, ψ) and the groove depth G is 0.04λ, where the electrode thickness H is 0.02λ. As for ψ, a value at which the absolute value of the secondary temperature coefficient β is the minimum is selected in the above-mentioned angle range on the basis of the set angle of θ. η is set to 0.6383 on the basis of the expression 23.

Under this condition, it can be seen from FIG. 28 illustrating the relation between θ and the secondary temperature coefficient β that when θ is in the range of 117° to 142°, the absolute value of the secondary temperature coefficient β is in the range of 0.01 ppm/° C.$^2$. Therefore, by determining θ in the range of 117°≦θ≦142° with the above-mentioned set value, it can be said that it is possible to implement the SAW resonator 10 having an excellent frequency-temperature characteristic.

Figure 29:
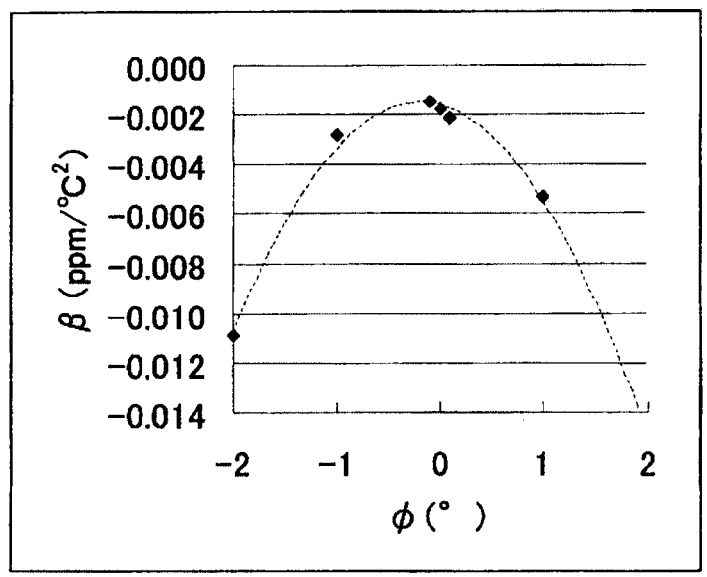
FIG. 29 is a graph illustrating the relation between the Euler angle φ and the secondary temperature coefficient β.

FIG. 29 is a graph illustrating the relation between the angle of ϕ and the secondary temperature coefficient β when the groove depth G is 0.04λ, the electrode thickness H is 0.02λ, and the line occupancy η is 0.65 in the quartz crystal substrate 30 with the Euler angle of (ϕ, 123°, 43.77°).

It can be seen from FIG. 29 that the secondary temperature coefficient β is lower than −0.01 when ϕ is −2° and +2°, but the absolute value of the secondary temperature coefficient β is in the range of 0.01 when ϕ is in the range of −1.5° to +1.5°. Therefore, by determining ϕ in the range of −1.5°≦ϕ≦+1.5° and preferably −1°≦ϕ≦+1° with the above-mentioned set value, it is possible to implement the SAW resonator 10 with an excellent frequency-temperature characteristic.

Figure 30:
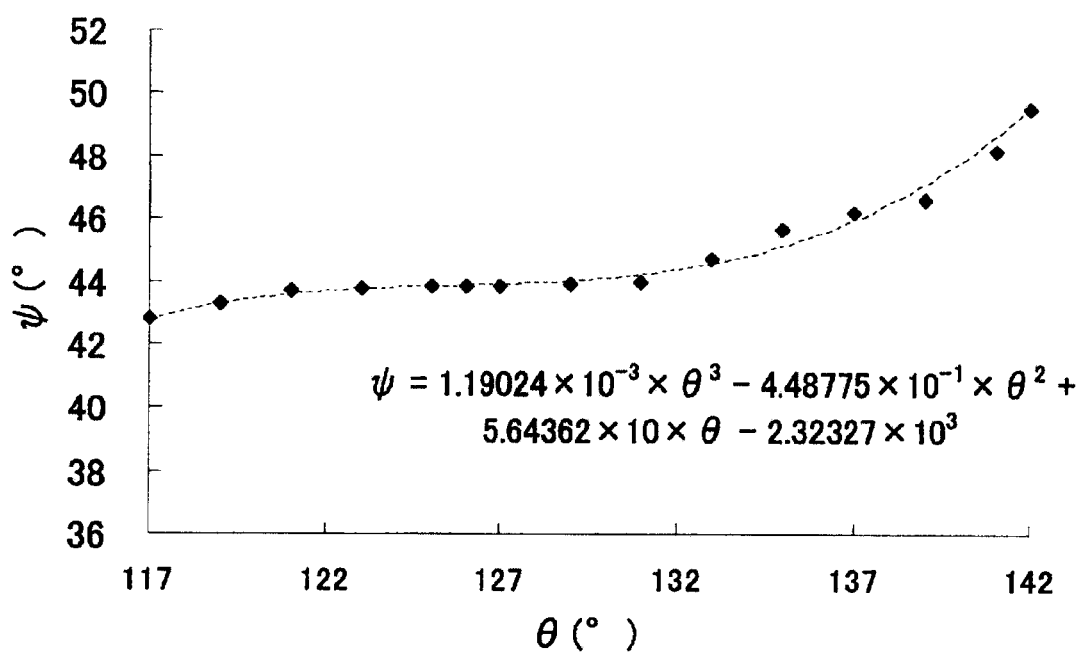
FIG. 30 is a graph illustrating the relation between the Euler angle θ and the Euler angle ψ in which the frequency-temperature characteristic is excellent.

In the above description, the optimal ranges of ϕ, θ, and ψ are derived from the relation to the groove depth G under a predetermined condition. On the contrary, FIG. 30 shows the very desirable relation between θ and ψ which the frequency variation is the minimum in the range of −40° C. to +85° C. and the approximate expression thereof is calculated. As shown in FIG. 30, the angle of ψ varies with the rising of the angle of θ and rises to draw a cubic curve. In the example shown in FIG. 30, ψ is 42.79° at θ=117° and ψ is 49.57° at θ=142°. The approximate curve of these plots is the curve indicated by the broken line in FIG. 30 and can be expressed by the following expression (25) as an approximate expression.

$$\psi = 1.19024 \times 10^{-3} \times \theta^3 - 4.48775 \times 10^{-1} \times \theta^2 + 5.64362 \times 10^1 \times \theta - 2.32327 \times 10^3 \pm 1.0 \quad (25)$$

From this expression, ψ can be determined by determining θ and the range of ψ when the range of θ is set to the range of 117°≦θ≦142° can be set to 42.79°≦ψ≦49.57°. The groove depth G and the electrode thickness H in the simulation are set to G=0.04λ and H=0.02λ.

For the above-mentioned reason, in this embodiment, by implementing the SAW resonator 10 under various predetermined conditions, it is possible to obtain a SAW resonator with an excellent frequency-temperature characteristic satisfying a target value.

Figure 37:
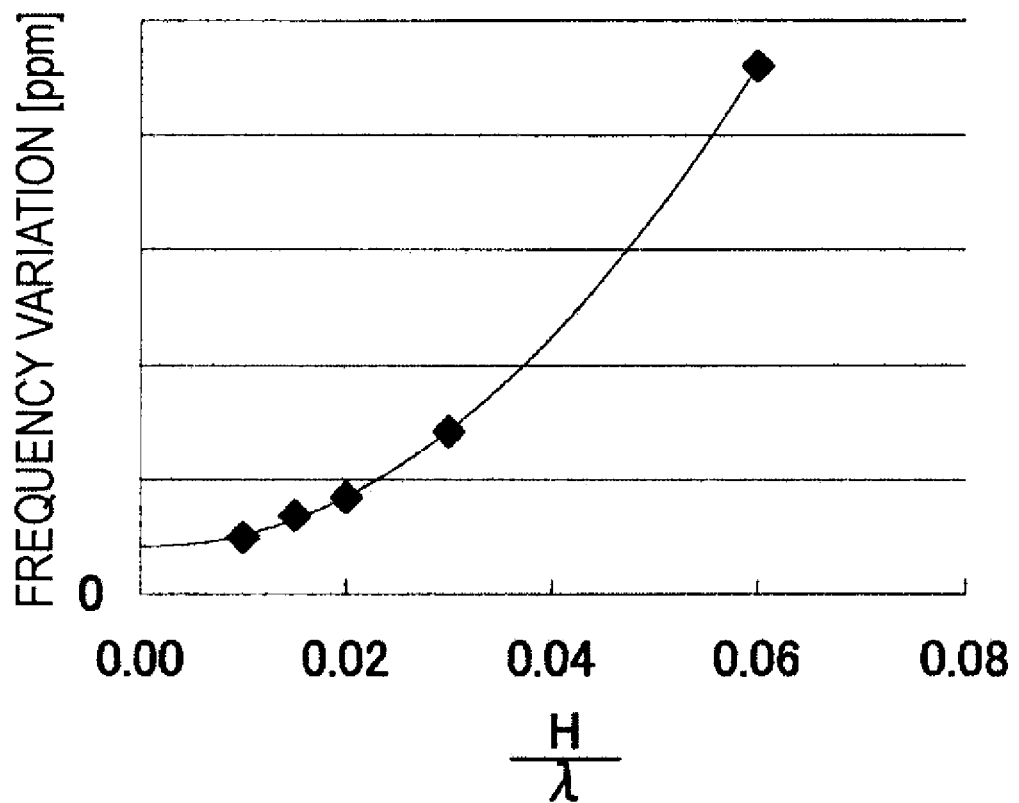
FIG. 37 is a graph illustrating the relation between the electrode thickness and the frequency variation in a heat cycle test.

In the SAW resonator 10 according to this embodiment, as shown in the expression (14) and FIGS. 12 to 23, it is possible to improve the frequency-temperature characteristic after the electrode thickness H is set to the range of 0<H≦035λ. Unlike the improvement of the frequency-temperature characteristic by greatly increasing the thickness H in the related art, it is possible to improve the frequency-temperature characteristic while maintaining the environment resistance characteristic. FIG. 37 shows the relation between the electrode thickness (Al electrode thickness) and the frequency variation in a heat cycle test. The result of the heat cycle test shown in FIG. 37 is obtained after the cycle that the SAW resonator is exposed to the atmosphere of −55° C. for 30 minutes and is then exposed to the atmosphere of +125° C. for 30 minutes is repeated eight times. It can be seen from FIG. 37 that the frequency variation (F variation) in the range of the electrode thickness H of the SAW resonator 10 according to this embodiment is equal to or less than ⅓ of that in the case where the electrode thickness H is 0.06λ and the inter-electrode-finger groove is not disposed. In any plot of FIG. 37, H+G=0.06λ is set.

A high-temperature shelf test of leaving a sample in the atmosphere of 125° C. for 1000 hours was performed on the SAW resonator produced under the same condition as shown in FIG. 37. It was confirmed that the frequency variation before and after the test of the SAW resonator (under four conditions of H=0.03λ and G=0.03λ, H=0.02λ and G=0.04λ, H=0.015λ and G=0.045λ, and H=0.01λ and G=0.05λ) is equal to or less than ⅓ of that of the existing SAW resonator (under the condition of H=0.06λ and G=0).

Figure 31:
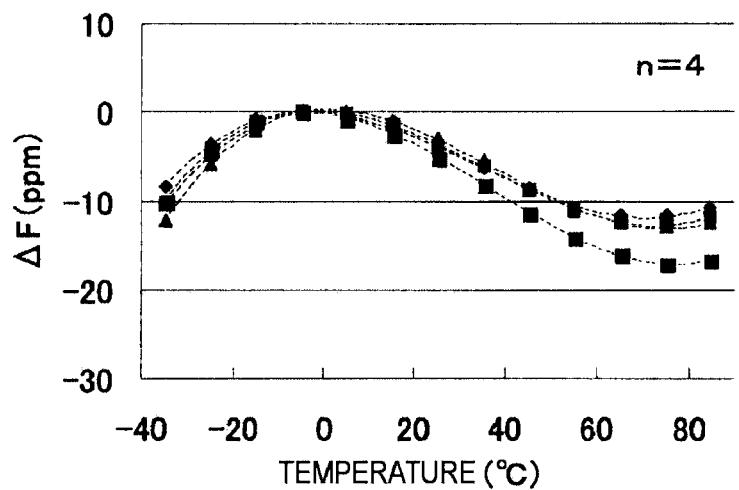
FIG. 31 is a diagram illustrating examples of frequency-temperature characteristic data in four sample pieces under the condition that the frequency-temperature characteristic is the best.

In the SAW resonator 10 produced under the same conditions as described above and the conditions of H+G=0.067λ (with an aluminum thickness 2000 Å and a groove depth of 4700 Å), the line occupancy of the IDT of ηi=0.6, the line occupancy of the reflector of ηr=0.8, the Euler angle of (0°, 123°, 43.5°), the number of IDT pairs of 120, the intersection width of 40λ (λ=10 μm), the number of reflectors (one side) of 72 (36 pairs), and the tilt angle of the electrode fingers of zero (the arrangement direction of the electrode fingers is equal to the phase speed direction of the SAW), the frequency-temperature characteristic shown in FIG. 31 is obtained.

FIG. 31 is a graph in which the frequency-temperature characteristics of four test samples (n=4) are plotted. It can be seen from FIG. 31 that the frequency variation ΔF in the operating temperature range of the test samples is equal to or less than about 20 ppm.

Figure 32:
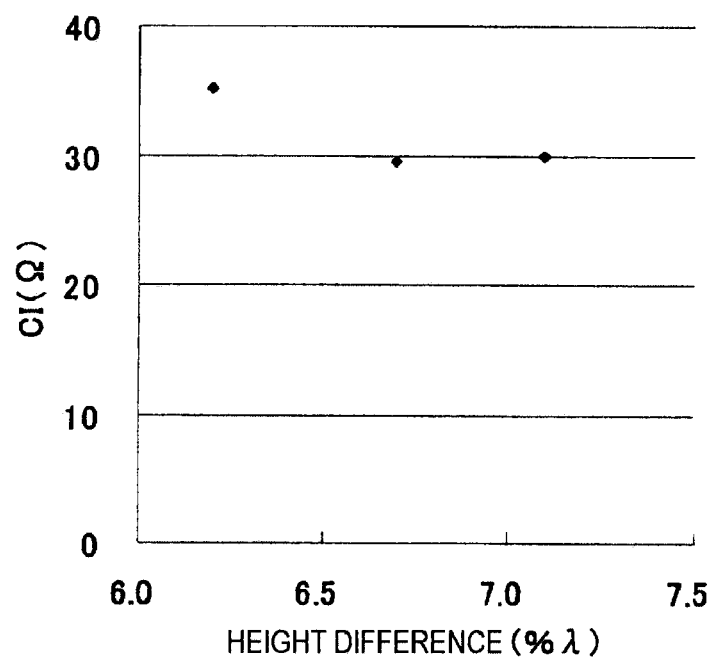
FIG. 32 is a graph illustrating the relation between a height difference which is the sum of the depth of the inter-electrode-finger groove and the electrode thickness and a CI value.

In this embodiment, the influence on the frequency-temperature characteristic depending on the groove depth G and the electrode thickness H has been described. However, the depth (height difference) which is the sum of the groove depth G and the electrode thickness H affects the static characteristics such as the equivalent circuit constant and the CI value or the Q value. For example, a graph illustrating the relation between the height difference and the CI value when the height difference is changed in the range of 0.062λ to 0.071λ is shown in FIG. 32. It can be seen from FIG. 32 that the CI value converges at the height difference of 0.067λ and is not changed (not lowered) even at a greater height difference.

Figures 33, 34:
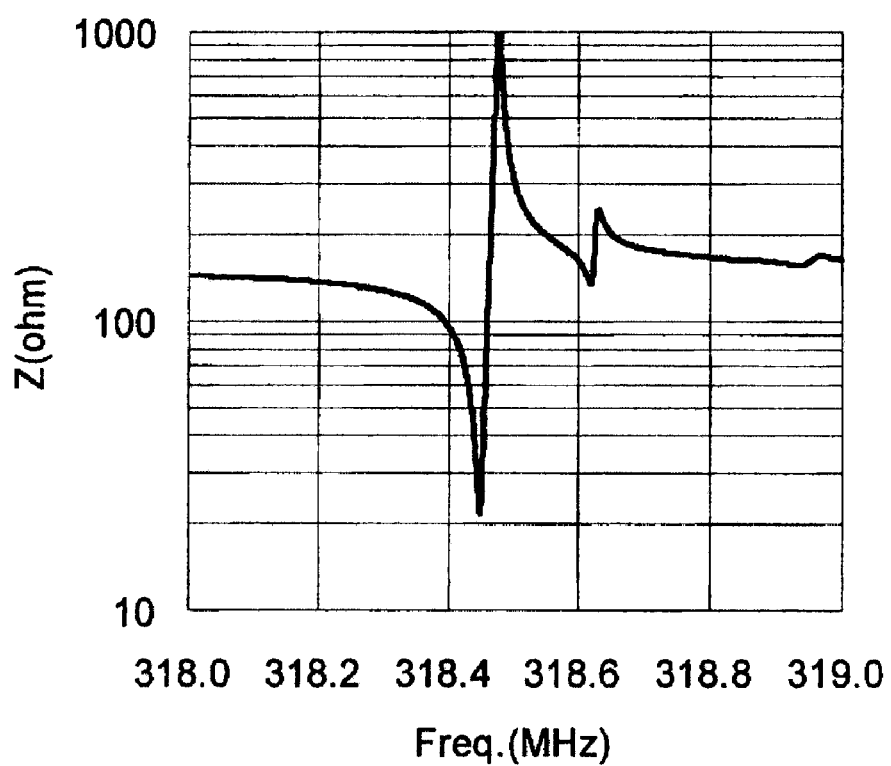
FIG. 33 is a table illustrating examples of a equivalent circuit constant and a static characteristic in the SAW resonator according to the embodiment of the invention.
FIG. 34 is a diagram illustrating impedance curve data in the SAW resonator according to the embodiment of the invention.

The frequency, the equivalent circuit constant, and the static characteristics in the SAW resonator 10 having the frequency-temperature characteristic shown in FIG. 31 are arranged in FIG. 33. Here, F represents the frequency, Q represents the Q value, γ represents a capacity ratio, CI represents the CI (Crystal Impedance) value, and M represents the performance index (figure of merit).

Figure 35:
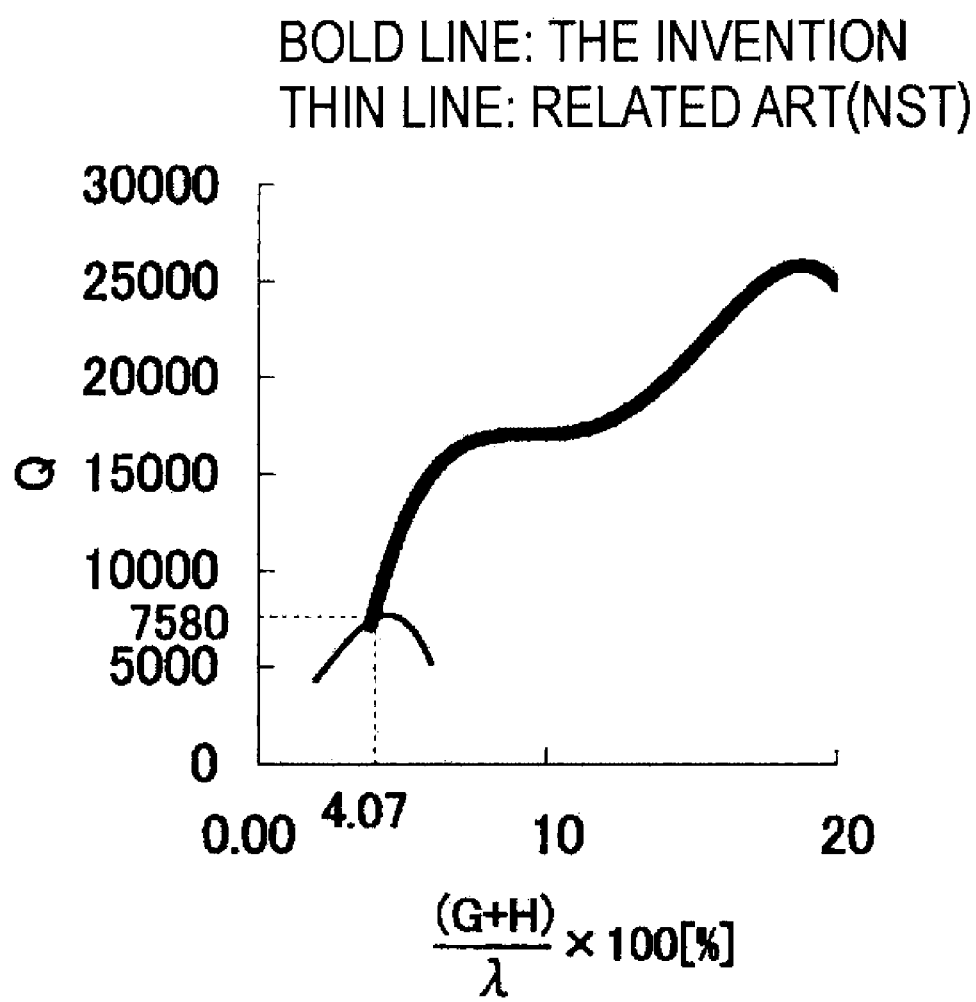
FIG. 35 is a graph illustrating the comparison of the relation between the height difference and the Q value in the SAW resonator according to the embodiment of the invention with the relation between the height difference and the Q value in the existing SAW resonator.

FIG. 35 shows a graph illustrating the comparison of the relations of the height difference and the Q value in the existing SAW resonator and the SAW resonator 10 according to this embodiment. In FIG. 35, the graph indicated by the bold line represents the characteristic of the SAW resonator 10 according to this embodiment, where the grooves are disposed between the electrode fingers and the resonance in the upper mode of the stop band is used. The graph indicated by the thin line represents the characteristic of the existing SAW resonator, where the grooves are not disposed in the electrode fingers and the resonance in the upper mode of the stop band is used. As can be clearly seen from FIG. 35, when the grooves are disposed between the electrode fingers and the resonance in the upper mode of the stop band is used, the Q value in the region where the height difference (G+H) is equal to or greater than 0.0407λ (4.07% λ) is higher than that in the case where the grooves are not disposed between the electrode fingers and the resonance in the lower mode of the stop band is used.

The basic data of the SAW resonator in the simulation is as follows. The basic data of the SAW resonator 10 according to this embodiment includes H: 0.02λ, G: variable, IDT line occupancy ηi: 0.6, reflector line occupancy ηr: 0.8, Euler angle: (0°, 123°, 43.5°), number of pairs: 120, intersection width: 40λ (λ=10 μm), number of reflectors (one side): 60, and no tilt angle of electrode finger. The basic data of the existing SAW resonator includes H: variable, G: zero, IDT line occupancy ηi: 0.4, reflector line occupancy ηr: 0.3, Euler angle: (0°, 123°, 43.5°), number of pairs: 120, intersection width: 40λ (λ=10 μm), number of reflectors (one side): 60, and no tilt angle of electrode finger.

By referring to FIG. 33 or 35 for the purpose of comparison of the characteristics of the SAW resonators, it can be understood how the SAW resonator 10 according to this embodiment increases in Q value. It is thought that the increase in Q value is due to the improvement of the energy trapping effect and the reason is as follows.

Figure 36:
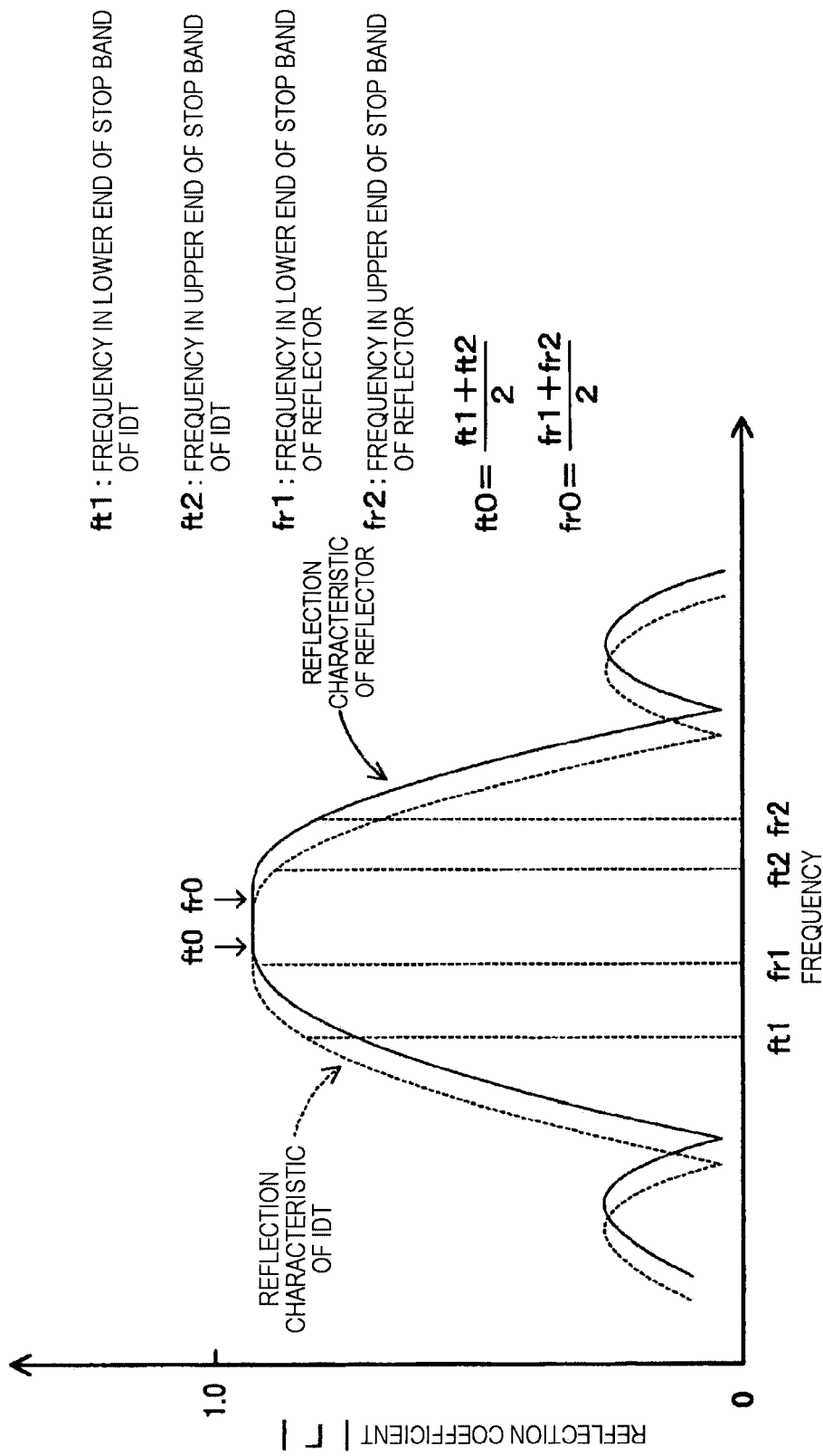
FIG. 36 is a diagram illustrating the SAW reflection characteristics of the IDT and the reflector.

In order to efficiently trap the energy of the surface acoustic wave excited in the upper mode of the stop band, the upper end frequency ft2 of the stop band of the IDT 12 can be set between the lower end frequency fr1 of the stop band of the reflector 20 and the upper end frequency fr2 of the stop band of the reflector 20, as shown in FIG. 36. That is, the frequencies can be set to satisfy the following expression (26).

$$fr1 < ft2 < fr2 \tag{26}$$

Accordingly, the reflection coefficient Γ of the reflector 20 becomes greater at the upper end frequency ft2 of the stop band of the IDT 12 and the SAW in the upper mode of the stop band excited from the IDT 12 is reflected to the IDT 12 with a higher reflection coefficient by the reflector 20. The energy trapping force of the SAW in the upper mode of the stop band is strengthened, thereby embodying a resonator with a low loss.

On the contrary, when the relation among the upper end frequency ft2 of the stop band of the IDT 12, the lower end frequency fr1 of the stop band of the reflector 20, and the upper end frequency fr2 of the stop band of the reflector 20 is set to ft2<fr1 or fr2<ft2, the reflection coefficient Γ of the reflector 20 at the upper end frequency ft2 of the stop band of the IDT 12 becomes smaller and it is thus difficult to obtain the strong energy trapping.

Here, in order to realize the state expressed by the expression (26), it is necessary to frequency-shift the stop band of the reflector 20 to the higher band side than the stop band of the IDT 12. Specifically, this state can be realized by setting the arrangement pitch of the conductor strips 22 of the reflector 20 to be smaller than the arrangement pitch of the electrode fingers 18 of the IDT 12. In another method, the thickness of the electrode film formed as the conductor strips 22 of the reflector 20 can be set to be smaller than the thickness of the electrode film formed as the electrode fingers 18 of the IDT 12 or the depth of the inter-conductor-strip groove of the reflector 20 can be set to be smaller than the depth of the inter-electrode-finger groove of the IDT 12. Two or more of the methods may be combined.

As can be clearly seen from FIG. 33, it is possible to obtain a high figure of merit M in addition to the increase in Q value. FIG. 34 is a graph illustrating the relation between the impedance Z and the frequency in the SAW resonator having the characteristics shown in FIG. 33. It can be seen from FIG. 34 that no useless spurious exists in the vicinity of the resonance point.

In the IDT 12 of the SAW resonator 10 according to this embodiment, all the electrode fingers are alternately intersected. However, the SAW resonator 10 according to the invention can exhibit the considerable advantage using only the quartz crystal substrate. Accordingly, even when the electrode fingers 18 of the IDT 12 are removed, the same advantage can be obtained.

The grooves 32 may be disposed partially between the electrode fingers 18 or between the conductor strips 22 of the reflector 20. Particularly, since the center portion of the IDT 12 with a high vibration displacement greatly affects the frequency-temperature characteristic, the grooves 32 may be disposed only in the center portion. With this configuration, it is possible to provide the SAW resonator 10 with an excellent frequency-temperature characteristic.

In the above-mentioned embodiment, Al or an alloy containing Al as a main component is used for the electrode films. However, another metal may be used for the electrode films as long as it provides the same advantages as the above-mentioned embodiment.

Although a one-terminal-pair SAW resonator having only one IDT is exemplified in the above-mentioned embodiment, the invention can be applied to a two-terminal-pair SAW resonator having plural IDTs and can be also applied to a vertical-coupling or horizontal-coupling double-mode SAW filter or multimode SAW filter.

Figure 38A:
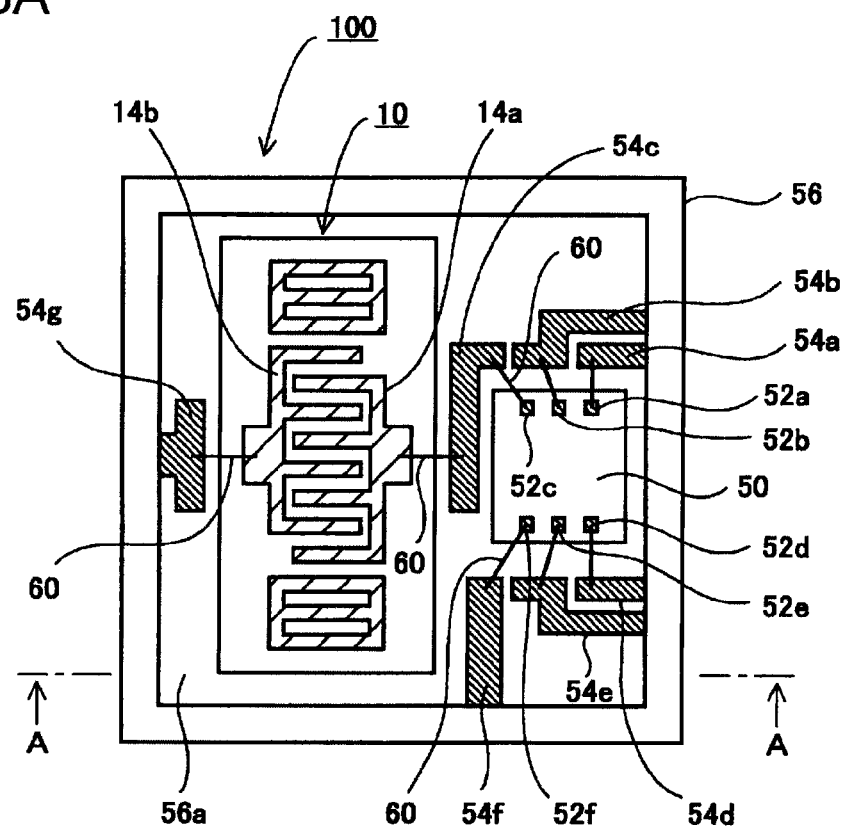
FIGS. 38A and 38B are diagrams illustrating the configuration of a SAW oscillator according to an embodiment of the invention.
Figure 38B:
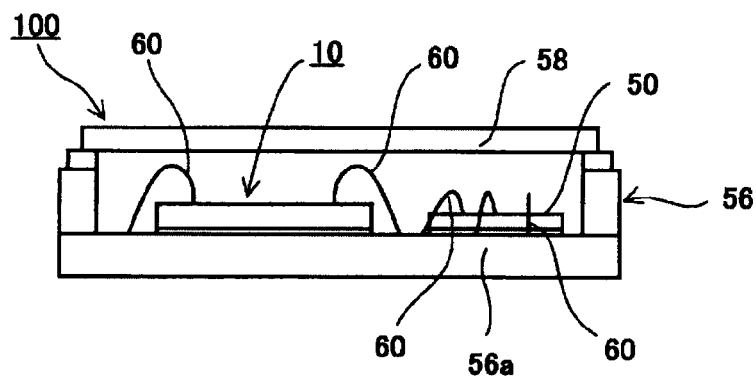

A SAW oscillator according to an embodiment of the invention will be described with reference to FIGS. 38A and 38B. As shown in FIGS. 38A and 38B, the SAW oscillator according to this embodiment includes the above-mentioned SAW resonator 10, an IC (Integrated Circuit) 50 controlling the driving of the SAW resonator by applying a voltage to the IDT 12 of the SAW resonator 10, and a package receiving the elements. FIG. 38A is a plan view in which leads are excluded and FIG. 38B is a sectional view taken along line XXXVIIIB-XXXVIIIB of FIG. 38A.

In the SAW oscillator 100 according to this embodiment, the SAW resonator 10 and the IC 50 are received in the same package 56, and electrode patterns 54a to 54g formed on a bottom plate 56a of the package 56, the pectinate electrodes 14a and 14b of the SAW resonator 10, and pads 52a to 52f of the IC 50 are connected to each other by metal wires 60. The cavity of the package 56 receiving the SAW resonator 10 and the IC 50 are air-tightly sealed with a lid 58. According to this configuration, the IDT 12 (see FIGS. 1A to 1C), the IC 50, and external mounting electrodes (not shown) formed on the bottom surface of the package 56 can be electrically connected to each other.

The entire disclosure of Japanese Patent Application No. 2009-045359, filed Feb. 27, 2009, Japanese Patent Application No. 2009-050112, filed Mar. 4, 2009 and Japanese Patent Application No. 2009-285224, filed Dec. 16, 2009 are expressly incorporated by reference herein.

What is claimed is:

1. A surface acoustic wave resonator comprising:
   an IDT which is disposed on a quartz crystal substrate with an Euler angle of ($-1.5° \leq \phi \leq 1.5°$, $117° \leq \theta \leq 142°$, $41.9° \leq |\psi| \leq 49.57°$) and which excites a surface acoustic wave in an upper mode of a stop band; and
   an inter-electrode-finger groove formed by recessing the quartz crystal substrate between electrode fingers of the IDT,
   wherein the following expression:

$$0.01\lambda \leq G$$

where $\lambda$ represents a wavelength of the surface acoustic wave and G represents a depth of the inter-electrode-finger groove, is satisfied and
   when a line occupancy of the IDT is $\eta$, the depth of the inter-electrode-finger groove G and the line occupancy $\eta$ are set to satisfy the following expression:

$$-2.5 \times G/\lambda + 0.675 \leq \eta \leq -2.5 \times G/\lambda + 0.775.$$

2. The surface acoustic wave resonator according to claim 1, wherein the depth of the inter-electrode-finger groove G satisfies the following expression:

$$0.01\lambda \leq G \leq 0.0695\lambda.$$

3. The surface acoustic wave resonator according to claim 1, wherein the following expression:

$$0 < H \leq 0.035\lambda$$

where H represents an electrode thickness of the IDT, is satisfied.

4. The surface acoustic wave resonator according to claim 3, wherein the line occupancy $\eta$ satisfies the following expression:

$$\eta = -2.533 \times G/\lambda - 2.269 \times H/\lambda + 0.785 \pm 0.04.$$

5. The surface acoustic wave resonator according to claim 3, wherein the sum of the depth of the inter-electrode-finger groove G and the electrode thickness H satisfies the following expression:

$$0.0407\lambda \leq G + H.$$

6. The surface acoustic wave resonator according to claim 1, wherein the $\psi$ and $\theta$ satisfy the following expression:

$$\psi = 1.191 \times 10^{-3} \times \theta^3 - 4.490 \times 10^{-1} \times \theta^2 + 5.646 \times 10^1 \times \theta - 2.324 \times 10^3 \pm 1.0.$$

7. The surface acoustic wave resonator according to claim 1, wherein the following expression:

$$fr1 < ft2 < fr2$$

where ft2 represents a frequency of the upper mode of the stop band in the IDT, fr1 represents a frequency of the lower mode of the stop band in reflectors disposed to interpose the IDT therebetween in a propagation direction of the surface acoustic wave, and fr2 represents a frequency of the upper mode of the stop band in the reflectors, is satisfied.

8. The surface acoustic wave resonator according to claim 1, wherein an inter-conductor-strip groove is disposed between conductor strips of the reflectors, and
   wherein the depth of the inter-conductor-strip groove is smaller than the depth of the inter-electrode-finger groove.

9. A surface acoustic wave oscillator comprising the surface acoustic wave resonator according to claim 1 and an IC driving the IDT.

* * * * *